(12) United States Patent
Watanabe

(10) Patent No.: US 10,795,761 B2
(45) Date of Patent: Oct. 6, 2020

(54) MEMORY SYSTEM AND METHOD OF CONTROLLING NON-VOLATILE MEMORY

(71) Applicant: Toshiba Memory Corporation, Minato-ku (JP)

(72) Inventor: Daiki Watanabe, Yokohama (JP)

(73) Assignee: Toshiba Memory Corporation, Minato-ku (JP)

(*) Notice: Subject to any disclaimer, the term of this patent is extended or adjusted under 35 U.S.C. 154(b) by 91 days.

(21) Appl. No.: 16/116,004

(22) Filed: Aug. 29, 2018

(65) Prior Publication Data
US 2019/0286517 A1 Sep. 19, 2019

(30) Foreign Application Priority Data
Mar. 15, 2018 (JP) ................... 2018-047848

(51) Int. Cl.
*G06F 11/10* (2006.01)
*G06F 3/06* (2006.01)
(Continued)

(52) U.S. Cl.
CPC ........ *G06F 11/1068* (2013.01); *G06F 3/0619* (2013.01); *G06F 3/0655* (2013.01);
(Continued)

(58) Field of Classification Search
CPC .. G06F 11/1068; G06F 3/0655; G06F 3/0619; G06F 3/0679; G06F 11/1012; H03M 13/2906; H03M 13/45; G11C 29/52
See application file for complete search history.

(56) References Cited

U.S. PATENT DOCUMENTS 4,630,032 A * 12/1986 Gordon ................. H04L 1/0054
341/51
6,526,538 B1 * 2/2003 Hewitt ............... H03M 13/2918
375/262
(Continued)

FOREIGN PATENT DOCUMENTS

JP 5039160 10/2012
JP 5068537 11/2012
(Continued)

OTHER PUBLICATIONS

Thesling et al., Pragmatic approach to soft-decision decoding of linear block codes, IEE Proceedings—Communications, vol. 142, Issue: 1, Pertinent pp. 40-47 (Year: 1995).*
(Continued)

*Primary Examiner* — April Y Blair
*Assistant Examiner* — Dipakkumar B Gandhi
(74) *Attorney, Agent, or Firm* — Oblon, McClelland, Maier & Neustadt, L.L.P.

(57) ABSTRACT

According to one embodiment, a memory system includes a first decoder that decodes read information read from a nonvolatile memory that records therein a multidimensional error-correcting code to output hard decision decoding information of each symbol; a second decoder that performs soft decision decoding in units of component codes for the read information using a soft-input value to output soft decision decoding information of each symbol; a soft-decision-decoding information memory that retains the soft decision decoding information of each symbol; and a soft-input-value specifying unit that obtains the soft-input value of each symbol using the read information and the hard decision decoding information or the soft decision decoding information, and the soft-input-value specifying unit obtains an initial value of the soft-input value using the read information and the hard decision decoding information, and outputs
(Continued)

an output decode word obtained as a result of the soft decision decoding when the output decode word is determined to be correct.

20 Claims, 9 Drawing Sheets

(51) Int. Cl.
*H03M 13/45* (2006.01)
*G11C 29/52* (2006.01)
*H03M 13/29* (2006.01)
*G06F 11/22* (2006.01)

(52) U.S. Cl.
CPC ............ *G06F 3/0679* (2013.01); *G11C 29/52* (2013.01); *H03M 13/2906* (2013.01); *H03M 13/45* (2013.01)

(56) References Cited

U.S. PATENT DOCUMENTS

| | | | | |
|---|---|---|---|---|
| 6,654,926 | B1* | 11/2003 | Raphaeli | H03M 13/2906 714/780 |
| 2006/0161830 | A1 | 7/2006 | Yedidia et al. | |
| 2008/0294965 | A1* | 11/2008 | Ni | G06F 11/1068 714/773 |
| 2009/0049365 | A1* | 2/2009 | Kim | G06F 11/1012 714/767 |
| 2011/0066923 | A1 | 3/2011 | Koshiyama et al. | |
| 2011/0219284 | A1 | 9/2011 | Uchikawa et al. | |
| 2011/0307758 | A1* | 12/2011 | Fillingim | G06F 11/1048 714/758 |
| 2012/0198314 | A1* | 8/2012 | Yang | G06F 11/1012 714/782 |
| 2012/0240007 | A1 | 9/2012 | Barndt et al. | |
| 2013/0061107 | A1* | 3/2013 | Wang | H03M 13/1137 714/752 |
| 2013/0077400 | A1 | 3/2013 | Sakurada | |
| 2014/0149828 | A1 | 5/2014 | Chang et al. | |
| 2016/0006462 | A1* | 1/2016 | Hanham | H03M 13/3715 714/764 |
| 2017/0068593 | A1 | 3/2017 | Yoshinaga et al. | |

FOREIGN PATENT DOCUMENTS

| | | |
|---|---|---|
| JP | 2013-80450 | 5/2013 |
| JP | 5540969 | 7/2014 |

OTHER PUBLICATIONS

Koetter et al., Algebraic soft-decision decoding of Reed-Solomon codes, IEEE, vol. 49, Issue 11, Pertinent pp. 2809-2825 (Year: 2003).*

Duggan et al., Performance Analysis of Algebraic Soft-Decision Decoding of Reed-Solomon Codes, 2008, IEEE, vol. 54, Issue: 11, Pertinent pp. 5012-5018 (Year: 2008).*

O'Keeffe et al., Hard and soft-decision list decoding of AG codes using Grobner basis solutions of constrained interpolations, IEEE, Conference Paper, Pertinent p. 315 (Year: 2002).*

* cited by examiner

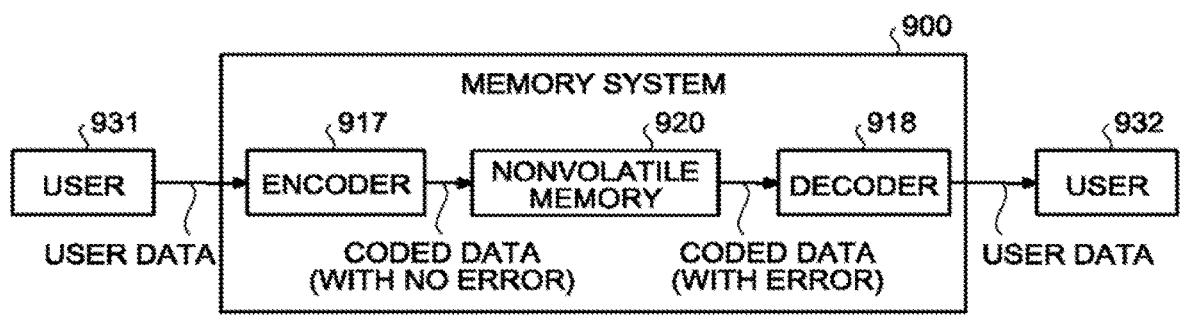
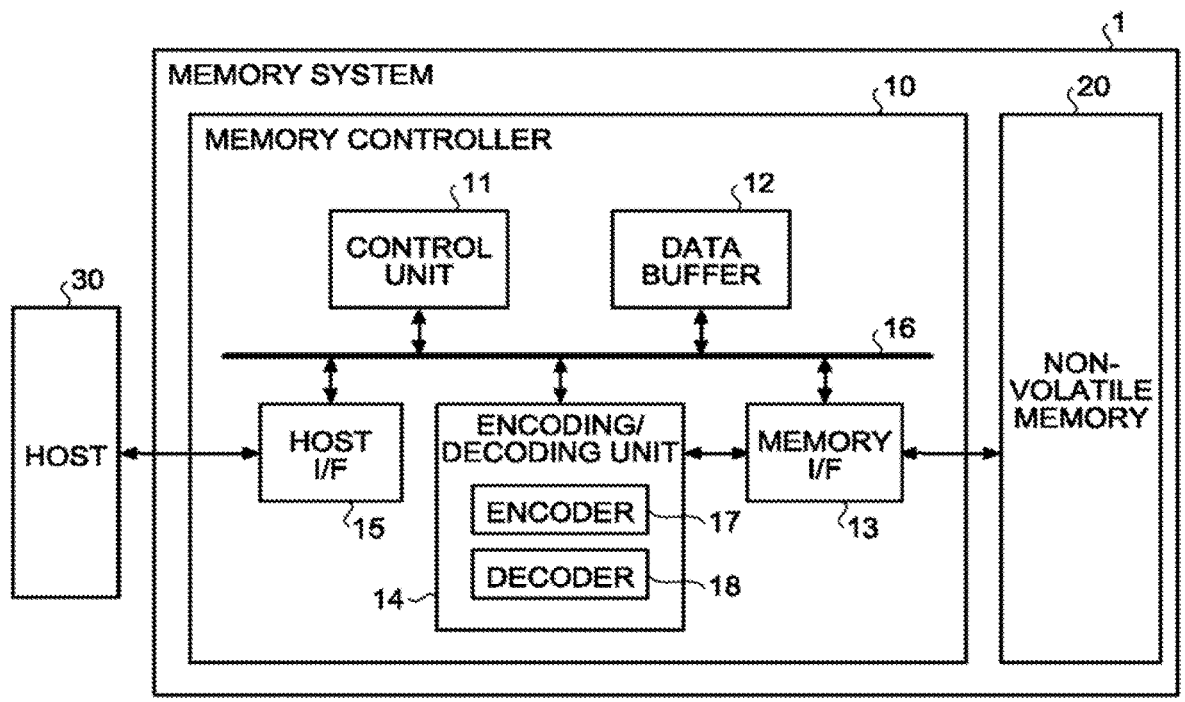

| ROW NUMBER i = | COLUMN NUMBER j = | | | | |
|---|---|---|---|---|---|
| | #1 | #2 | #3 | #4 | #5 |
| #1 | 0 | 0 | 1 | 0 | 0 |
| #2 | 0 | 1 | 0 | 0 | 1 |
| #3 | 0 | 0 | 0 | 0 | 0 |
| #4 | 0 | 1 | 1 | 0 | 0 |
| #5 | 0 | 0 | 1 | 0 | 0 |

(BEFORE HIHO DECODING)

(b)

| | #1 | #2 | #3 | #4 | #5 |
|---|---|---|---|---|---|
| #1 | 0 | 0 | 0 | 0 | 0 |
| #2 | 0 | 1 | 1 | 0 | 0 |
| #3 | 0 | 0 | 0 | 0 | 0 |
| #4 | 0 | 1 | 1 | 0 | 0 |
| #5 | 0 | 0 | 0 | 0 | 0 |

(AFTER HIHO DECODING)

FIG.10

| ROW/COLUMN NUMBER | ROW SYNDROME | COLUMN SYNDROME |
|---|---|---|
| #1 | 0 | 0 |
| #2 | NON-ZERO | NON-ZERO |
| #3 | 0 | NON-ZERO |
| #4 | NON-ZERO | 0 |
| #5 | 0 | 0 |

FIG.11

| ROW NUMBER i = | COLUMN NUMBER j = | | | | |
|---|---|---|---|---|---|
| | #1 | #2 | #3 | #4 | #5 |
| #1 | 5 | 5 | 10 | 5 | 5 |
| #2 | 0 | 0 | 0 | 0 | 0 |
| #3 | 5 | 5 | 5 | 5 | 5 |
| #4 | 0 | 0 | 0 | 0 | 0 |
| #5 | 5 | 5 | 10 | 5 | 5 |

FIG.12

| ROW NUMBER i = | COLUMN NUMBER j = | | | | |
|---|---|---|---|---|---|
| | #1 | #2 | #3 | #4 | #5 |
| #1 | 5 | 0 | 0 | 5 | 5 |
| #2 | 5 | 0 | 0 | 5 | 10 |
| #3 | 5 | 0 | 0 | 5 | 5 |
| #4 | 5 | 0 | 0 | 5 | 5 |
| #5 | 5 | 0 | 0 | 5 | 5 |

MEMORY SYSTEM AND METHOD OF CONTROLLING NON-VOLATILE MEMORY

CROSS-REFERENCE TO RELATED APPLICATIONS

This application is based upon and claims the benefit of priority from Japanese Patent Application No. 2018-047848, filed on Mar. 15, 2018; the entire contents of all of which are incorporated herein by reference.

FIELD

Embodiments described herein relate generally to a memory system and a method of controlling a non-volatile memory.

BACKGROUND

In order to protect data stored in a memory system, data subjected to error correcting coding is generally stored therein. Therefore, when the data stored in the memory system is to be read, decoding of the data subjected to error correcting coding is performed.

BRIEF DESCRIPTION OF THE DRAWINGS

FIG. 1 is an explanatory diagram of a general flow of an operation to protect data with an error-correcting code;

FIG. 2 is a block diagram illustrating a schematic configuration example of a memory system according to a first embodiment;

FIG. 9 are diagrams illustrating an example of input/output information of HIHO decoding according to the first embodiment;

FIG. 10 is a diagram illustrating syndromes calculated from a post-decoding hard decision value illustrated in FIG. 9(*b*);

FIG. 11 is a diagram illustrating an example of an initial value of a dimension-1 external value calculated from a pre-decoding hard decision value illustrated in FIG. 9(*a*), the post-decoding hard decision value illustrated in FIG. 9(*b*), and syndromes calculated from component codes after HIHO decoding illustrated in FIG. 10;

FIG. 12 is a diagram illustrating an example of an initial value of a dimension-2 external value similarly calculated from the pre-decoding hard decision value illustrated in FIG. 9(*a*), the post-decoding hard decision value illustrated in FIG. 9(*b*), and the syndromes calculated from the component codes after the HIHO decoding illustrated in FIG. 10;

DETAILED DESCRIPTION

Figure 3:
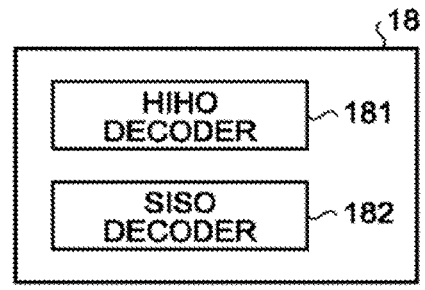
FIG. 3 is a block diagram illustrating a schematic configuration example of a decoder according to the first embodiment.

In general, according to one embodiment, a memory system includes: a nonvolatile memory that records therein a multidimensional error-correcting code in which at least one of symbols constituting a code is protected at least by a first component code and a second component code different from the first component code; a memory interface that reads the multidimensional error-correcting code recorded in the nonvolatile memory as read information; a first decoder that performs decoding of the read information to output hard decision decoding information of each symbol; a second decoder that performs soft decision decoding in units of component codes for the read information using a soft-input value to output soft decision decoding information of each symbol; a soft-decision-decoding information memory that retains the soft decision decoding information of each symbol output from the second decoder; and a soft-input-value specifying unit that obtains the soft-input value of each symbol using the read information and the hard decision decoding information or the soft decision decoding information, wherein the soft-input-value specifying unit obtains an initial value of the soft-input value using the read information and the hard decision decoding information, and outputs an output decode word obtained as a result of the soft decision decoding when the output decode word is determined to be correct.

Exemplary embodiments of a memory system and a method of controlling a non-volatile memory will be explained below in detail with reference to the accompanying drawings. The present invention is not limited to the following embodiments.

In recent years, a memory system utilizing a nonvolatile memory such as a NAND flash memory is used in various locations taking advantage of a characteristic of a high-speed performance. However, data read from a nonvolatile memory may include an error resulting from passage of a time from recording of the data in the nonvolatile memory or noise occurring during read or write. Accordingly, data to be recorded in a nonvolatile memory is generally subjected to coding processing using an error-correcting code and is subjected to decoding processing using the error-correcting code when the data is to be read, thereby to eliminate an error included in the read data.

FIG. 1 is an explanatory diagram of a general flow of an operation to protect data with an error-correcting code. A user in the present descriptions can be, for example, an information processor such as a personal computer, a server device, a portable information appliance, or a digital still camera.

A user 931 transmits data to be written (hereinafter, "user data") to a memory system 900. The memory system 900 encodes the user data received from the user 931 using an encoder 917, and writes coded data (a code word) thus generated to a nonvolatile memory 920. Therefore, the coded data written to the nonvolatile memory 920 basically includes no error.

The coded data stored in the nonvolatile memory 920 is read in response to a read request from a user 932, for example. However, there is a possibility that the read coded data includes an error. Accordingly, a decoder 918 performs decoding while eliminating the error included in the read coded data, to restore original coded data. The original coded data or the restored pre-coding user data is thereafter transmitted to the user 932. The user 932 having issued the read request can be the same user as the user 931 that has issued a write request or can be a different user.

A case where the encoder 917 encodes user data to coded data composed of binary information (bits) represented by '0' or '1' and the coded data is recorded in the nonvolatile memory 920 as binary information is assumed below. In the present and subsequent descriptions, when recorded data is read as binary information indicating whether the recoded data is '0' or '1' and is input to a decoder at a time of read of data from a nonvolatile memory, the input information is referred to as "Hard-Input". In contrast thereto, when recorded data is read as information of the probability that the data is '0' or the probability that the data is '1' and is input to a decoder, the probability information is referred to as "Soft-Input". When a decoding result output by a decoder is composed of binary information indicating whether original user data is '0' or '1', the output information is referred to as "Hard-Output". In contrast thereto, when a decoding result output by a decoder includes information of the probability that each bit value (or symbol value) of original user data is '0' or '1', the output information is referred to as "Soft-Output".

SISO (Soft-Input Soft-Output) decoding using a Soft-Input as an input to the decoder 918 enables decoding using more information than HIHO (Hard-Input Hard-Output) decoding using a Hard-Input. Accordingly, when read coded data includes many errors, the SISO decoding can enhance the probability that user data can be decoded correctly as compared with the HIHO decoding.

When coded data written to the nonvolatile memory 920 is, for example, a binary code that represents information with bits of '0' or '1', a Log-Likelihood-Ratio (LLR) representation which is the natural log of the ratio between the probability that a bit is '0' and the probability that the bit is '1' is often used as a Soft-Input value and a Soft-output value. When an LLR is a negative (−) value, the original write value is estimated to be '1'. On the other hand, when an LLR is a positive (+) value, the original write value is estimated to be '0'. The magnitude of the absolute value of an LLR is related to the probability that the original write value is a value estimated by a positive or negative sign of the LLR. For example, in a case where an LLR is '+9', the probability that the original write value is '0' is higher than in a case where an LLR is '+1'. Similarly, in a case where an LLR is '−9', the probability that the original write value is '1' is higher than in a case where an LLR is '−1'.

The coded data of a binary code can be represented as a vector of a bit value. Accordingly, a Soft-Input value or a Soft-Output value of a binary code can be represented as a vector of an LLR (a real value). While a case where probability information of a Soft-Input value and a Soft-Output value is represented as a vector of an LLR is described as an example to simplify the descriptions in following embodiments, the embodiments are not limited to this case and can be variously modified.

First Embodiment

FIG. 2 is a block diagram illustrating a schematic configuration example of a memory system and a method of controlling a non-volatile memory according to a first embodiment. As illustrated in FIG. 2, a memory system 1 includes a memory controller 10 and a nonvolatile memory 20. The memory system 1 is connectable to a host 30 and a state where the memory system 1 is connected to the host 30 is illustrated in FIG. 2. The host 30 can be, for example, an electronic device such as a personal computer or a mobile terminal.

The nonvolatile memory 20 is a nonvolatile memory that stores therein data in a nonvolatile manner and is, for example, a NAND flash memory (hereinafter, simply "NAND memory"). While a case where a NAND memory is used as the nonvolatile memory 20 is described as an example in the following descriptions, a storage device other than the NAND memory, such as a three-dimensional structural flash memory, a ReRAM (Resistance Random Access Memory), or a FeRAM (Ferroelectric Random Access Memory) can be used as the nonvolatile memory 20. It is not essential that the nonvolatile memory 20 is a semiconductor memory and the present embodiment can be applied to various storage media other than the semiconductor memory.

The memory system 1 can be a memory card including the memory controller 10 and the nonvolatile memory 20 configured as one package, or can be an SSD (Solid State Drive).

The memory controller 10 is, for example, a semiconductor integrated circuit configured as a Soc (System-On-a-Chip). Some or all of operations of respective constituent elements of the memory controller 10 described below can be realized by firmware executed by a CPU (Central Processing Unit) or can be realized by hardware.

The memory controller 10 controls write to the nonvolatile memory 20 in response to a write request from the host 30. The memory controller 10 also controls read from the nonvolatile memory 20 in response to a read request from the host 30. The memory controller 10 includes a host I/F (host interface) 15, a memory I/F (memory interface) 13, a control unit 11, an encoding/decoding unit (codec) 14, and a data buffer 12. The host I/F 15, the memory I/F 13, the control unit 11, the encoding/decoding unit 14, and the data buffer 12 are connected to each other with an internal bus 16.

The host I/F 15 performs processing according to interface standards for the host 30 and outputs a request, user data to be written, and the like, received from the host 30 to the internal bus 16. The host I/F 15 transmits user data read from the nonvolatile memory 20 and restored, a response from the control unit 11, and the like to the host 30.

The memory I/F 13 performs write processing to the nonvolatile memory 20 based on an instruction of the control unit 11. The memory I/F 13 also performs read processing from the nonvolatile memory 20 based on an instruction of the control unit 11.

The control unit 11 controls the respective constituent elements of the memory system 1 in an integrated manner. When receiving a request from the host 30 via the host I/F 15, the control unit 11 executes control according to the request. For example, the control unit 11 instructs the memory I/F 13 to write user data and a parity to the nonvolatile memory 20 in response to a write request from the host 30. The control unit 11 instructs the memory I/F 13 to read user data and a parity from the nonvolatile memory 20 in response to a read request from the host 30.

When receiving a write request from the host 30, the control unit 11 determines a storage area (a memory area) on the nonvolatile memory 20 for user data accumulated in the data buffer 12. That is, the control unit 11 manages write destinations of user data. A correspondence between logical addresses of user data received from the host 30 and physical addresses respectively indicating storage areas on the nonvolatile memory 20 in which the user data is stored is stored as an address conversion table.

When receiving a read request from the host 30, the control unit 11 converts a logical address specified by the read request into a physical address using the address conversion table described above and instructs the memory I/F 13 to read data from the physical address.

Generally, in a NAND memory, write and read are performed in data units called "page" and erase is performed in data units called "block". In the present embodiment, a plurality of memory cells connected to a same word line are called "memory cell group". When memory cells are single-level cells (SLCs), one memory cell group corresponds to one page. When memory cells are multi-level cells (MLCs), one memory cell group corresponds to a plurality of pages. Each memory cell is connected also to a bit line as well as being connected to a word line. Therefore, each memory cell can be identified by an address that identifies a word line and an address that identifies a bit line.

The data buffer 12 temporarily stores therein user data received by the memory controller 10 from the host 30 until the user data is stored in the nonvolatile memory 20. The data buffer 12 also temporarily stores therein user data read from the nonvolatile memory 20 until the user data is transmitted to the host 30. For example, a general-purpose memory such as an SRAM (Static Random Access Memory) or a DRAM (Dynamic Random Access Memory) can be used as the data buffer 12.

User data transmitted from the host 30 is transferred to the internal bus 16 and is temporarily stored in the data buffer 12. The encoding/decoding unit 14 encodes user data to be stored in the nonvolatile memory 20 to generate coded data (a code word). The encoding/decoding unit 14 decodes coded data (also "read information" or "received word") read from the nonvolatile memory 20 to restore the user data. For this purpose, the encoding/decoding unit 14 includes an encoder 17 and a decoder 18. Data encoded by the encoding/decoding unit 14 can include control data to be used in the memory controller 10, as well as user data.

In write processing in the memory system 1 having the configuration described above, the control unit 11 instructs the encoder 17 to encode user data at a time of write to the nonvolatile memory 20. At that time, the control unit 11 determines a storage place (a storage address) of a code word in the nonvolatile memory 20 and instructs also the determined storage place to the memory I/F 13. The encoder 17 encodes user data on the data buffer 12 based on an instruction from the control unit 11 to generate a code word. A coding system using, for example, an LDPC (Low-Density Parity-Check) code, a BCH (Bose-Chaudhuri-Hocquenghem) code, or an RS (Read-Solomon) code can be adopted as a coding system.

Meanwhile, in read processing, the control unit 11 specifies an address on the nonvolatile memory 20 and instructs the memory I/F 13 to read data at a time of read from the nonvolatile memory 20. The control unit 11 also instructs the decoder 18 to start decoding. The memory I/F 13 performs read from the specified address on the nonvolatile memory 20 in response to an instruction from the control unit 11 and inputs read information obtained by this read to the decoder 18. The decoder 18 decodes the input read information.

As described above, the SISO decoding using a Soft-Input as an input to the decoder 18 can enhance the probability that user data can be decoded correctly as compared to the HIHO decoding using a Hard-Input. However, the SISO decoding generally has characteristics of being longer in the processing time while being higher in the error correction capability than the HIHO decoding. Therefore, in the present embodiment, the decoder 18 includes an HIHO decoder 181 that performs decoding using a hard decision value as an input and outputs a hard decision value as a result thereof, and an SISO decoder 182 that performs decoding using a soft decision value as an input and outputs a soft decision value as a result thereof as illustrated in FIG. 3. In the decoder 18, the HIHO decoder 181 first performs HIHO decoding of a received word read as a hard decision value from the nonvolatile memory 20. When the HIHO decoding fails, a received word of a soft decision value is read from the nonvolatile memory 20. The SISO decoder 182 then performs the SISO decoding of the received word read as the soft decision value. However, the present embodiment is not limited to this configuration and can be variously modified to, for example, a configuration where the HIHO decoding is omitted and the SISO decoding is performed to all received words. Alternatively, the HIHO decoding can be applied to a BCH code, an RS code, and the like and the SISO decoding can be applied to an LDPC and the like. However, the present embodiment is not limited thereto.

The SISO decoder 182 can be used as, for example, a component code decoder for a multidimensional error-correcting code. A multidimensional error-correcting code indicates an error-correcting code where at least one or more symbols, which are constitutional units of the error-correcting code, are protected multiply by a plurality of smaller component codes. At that time, one symbol is composed of, for example, an element of one bit (a binary field) or an element of an alphabet such as a finite field other than the binary field.

Figure 4:
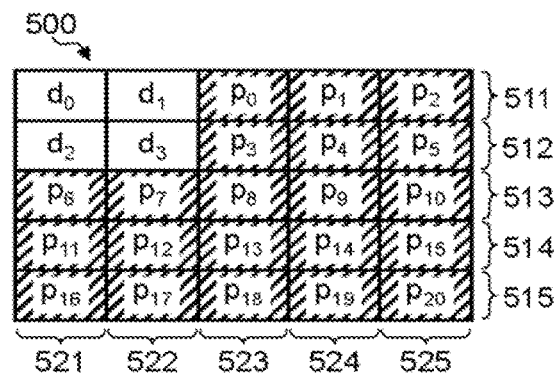
FIG. 4 is a diagram illustrating an example of a multidimensional error-correcting code according to the first embodiment.

FIG. 4 illustrates a product code as an example of the multidimensional error-correcting code. A product code 500 illustrated in FIG. 4 has a structure in which respective information bits (which can alternatively be symbols) $d_0$ to $d_3$ being constitutional units, respectively, are protected by hamming codes 511 to 515 and 521 to 525 having an information length of two bits and having a parity length of three bits in each of a row direction (a horizontal direction in FIG. 4) and a column direction (a vertical direction in FIG. 4). In the product code 500 described above, all the information bits $d_0$ to $d_3$ and parity bits $p_0$ to $p_{20}$ are protected doubly by a hamming code in the row direction (also "dimension 1") and a hamming code in the column direction (also "dimension 2").

The multidimensional error-correcting code is not limited to the product code 500 illustrated in FIG. 4 and can be, for example, a generalized Low Density Parity Check Code (a generalized LDPC code). In a general multidimensional error-correcting code including the generalized LDPC code, the multiplicity of protection can differ according to the symbols. Although the component codes cannot be grouped into the dimension 1 and the dimension 2 in the general multidimensional error-correcting code, the present technique is applicable also to the multidimensional error-correcting code having such a code structure.

Figure 5:
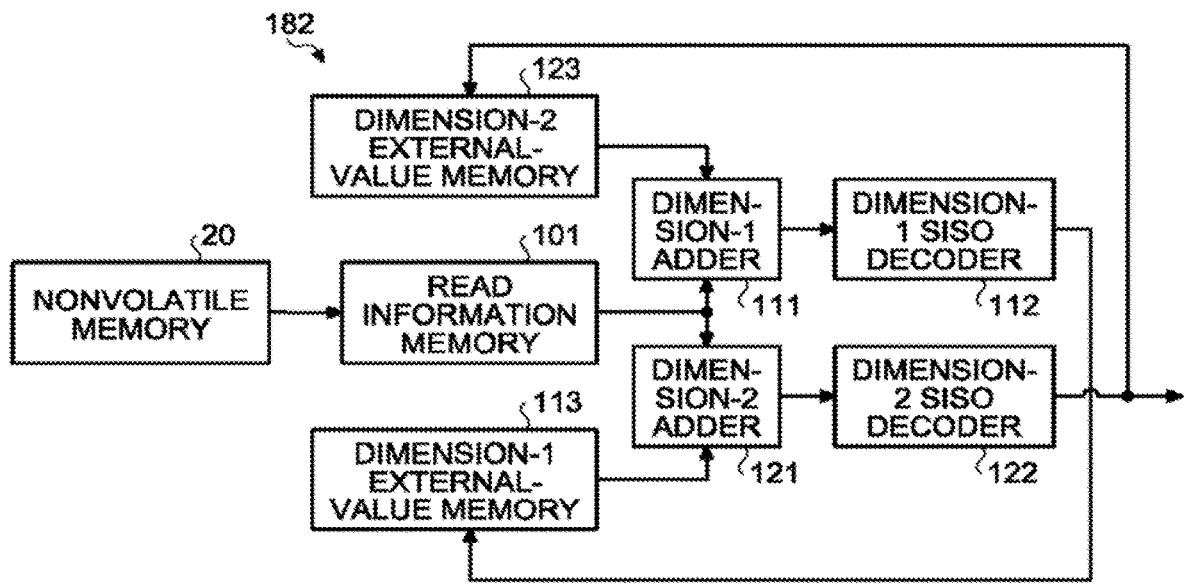
FIG. 5 is a block diagram illustrating an example of an SISO decoder according to the first embodiment.
Figure 6:
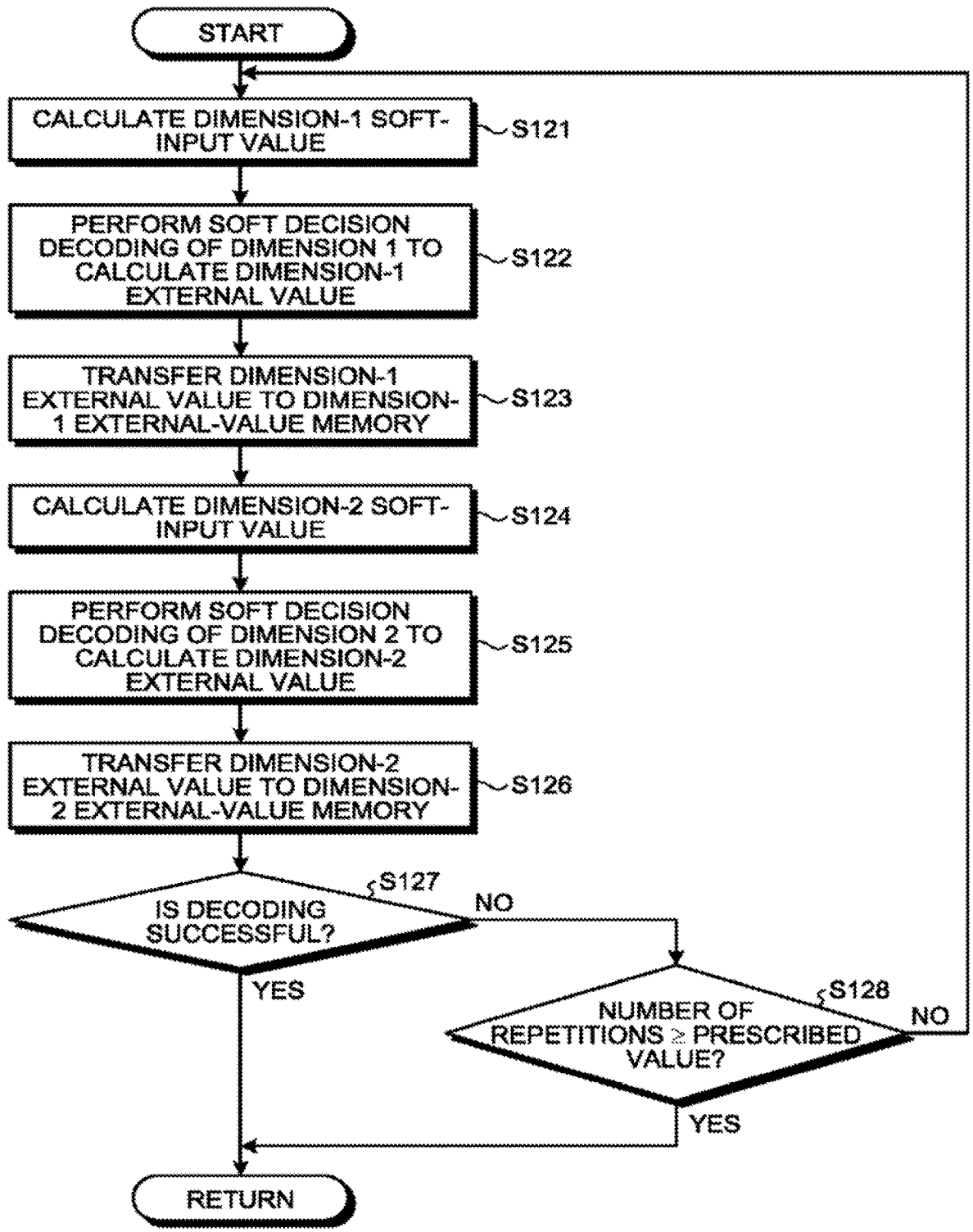
FIG. 6 is a flowchart illustrating an example of a turbo decoding operation performed by the SISO decoder illustrated in FIG. 5.

Furthermore, turbo decoding can be performed to the multidimensional error-correcting code described above. FIG. 5 is a block diagram illustrating an example of the SISO decoder that performs turbo decoding of a two-dimensional error-correcting code. FIG. 6 is a flowchart illustrating an example of a turbo decoding operation performed by the SISO decoder illustrated in FIG. 5.

As illustrated in FIG. 5, the SISO decoder 182 that performs turbo decoding of a two-dimensional error-correcting code includes a dimension-1 adder (a soft-input-value specifying unit) 111, a dimension-1 SISO decoder 112, a dimension-1 external-value memory 113, a dimension-2 adder (a soft-input-value specifying unit) 121, a dimension-2 SISO decoder 122, and a dimension-2 external-value memory 123. A read information memory 101 that retains read information (a received word) read by the memory I/F 13 from the nonvolatile memory 20 is provided at an input stage of the SISO decoder 182.

In the turbo decoding operation performed by the SISO decoder 182 configured as described above, as illustrated in FIG. 6, read information in the read information memory 101 and a dimension-2 external value (also "dimension-2 soft-decision-decoding information") in the dimension-2 external-value memory 123 are added by the dimension-1 adder 111, thereby calculating a dimension-1 soft-input value (=read information+dimension-2 external value) (Step S121).

Subsequently, the dimension-1 soft-input value calculated by the dimension-1 adder 111 is input to the dimension-1 SISO decoder 112 with respect to each component code. The dimension-1 SISO decoder 112 performs soft decision decoding of the dimension 1 to the input dimension-1 soft-input value to calculate a dimension-1 external value (also "dimension-1 soft-decision-decoding information") (Step S122). The calculated dimension-1 external value is transferred to the dimension-1 external-value memory 113 and is retained therein (Step S123).

Next, the read information in the read information memory 101 and the dimension-1 external value in the dimension-1 external-value memory 113 are added by the dimension-2 adder 121, thereby calculating a dimension-2 soft-input value (=read information+dimension-1 external value) (Step S124).

Subsequently, the dimension-2 soft-input value calculated by the dimension-2 adder 121 is input to the dimension-2 SISO decoder 122 with respect to each component code. The dimension-2 SISO decoder 122 performs soft decision decoding of the dimension 2 to the input dimension-2 soft-input value to calculate a dimension-2 external value (Step S125). The calculated dimension-2 external value is transferred to the dimension-2 external memory 123 and is retained therein (Step S126).

Next, whether decoding has been successful is determined (Step S127). A state where decoding has been successful can be, for example, that a decode word that can be determined to be correct has been found. When decoding has been successful (YES at Step S127), the control unit 11 located outside or the like is notified of the success of the decoding and the found decode word, for example. On the other hand, when decoding has not been successful (NO at Step S127), whether the number of repetitions of the present operation has reached a prescribed value set in advance is determined (Step S128). When the number of repetitions has not reached the prescribed value (NO at Step S128), the process returns to Step S121 to perform the following operations. On the other hand, when the number of repetitions has reached the prescribed value (YES at Step S128), the control unit 11 located outside or the like is notified of a failure of the decoding, for example. The number of repetitions can be, for example, the number of times when the operations from Steps S121 to S126 in FIG. 6 have been repeated.

For example, a Max-log-MAP (Maximum A Posteriori) decoder that adopts a decoding algorithm to calculate an external value can be used as the dimension-1 SISO decoder 112 and the dimension-2 SISO decoder 122 in the configuration illustrated in FIG. 5. The Max-log-MAP decoder is a decoder that calculates a posterior probability value of each bit from a MAP decode word and an opposed decode word of the relevant bit. In order to simplify descriptions, a quantity that is proportional to the posterior probability and an approximate value thereof are also hereinafter referred to as "posterior probability". For example, assuming that prior probabilities of all code words are equal, the likelihood of a decode word is a quantity proportional to the posterior probability value of the decode word.

A MAP decode word c* indicates a code word c*=argmax$_c$P(c|S) calculated from a soft-input value S and having a highest posterior probability P among all code words c∈C. Furthermore, an opposed decode word of an ith bit indicates a code word $c_{p,i}$=argmax$_c$P(c|S, $c_i$≠$c^*_i$) calculated from the soft-input value S and having the highest posterior probability P out of code words having a different value from the MAP decode word c* at the ith bit among the all the code words c∈C. Therefore, an intermediate hard decision value calculated in the middle of decoding by the Max-log-MAP decoder includes the MAP decode word c* and all the opposed code words $c_{p,i}$.

A set C'⊂C of code words having a relatively high posterior probability can be used instead of the set C of all the code words. In this case, an approximate MAP decode word and an approximate opposed decode word of an ith bit are obtained. The Max-Log-MAP decoding using the subset C' of code words has characteristics that the calculation amount is reduced and thus decoding can be performed faster while being lower in the correction capability than the Max-log-MAP decoding using the set C of all the code words. In order to simplify the descriptions, an approximate MAP decode word is also hereinafter referred to as "MAP decode word".

In the Max-log-MAP decoding using the subset C' of code words, a log posterior probability ratio R of an ith bit is approximately calculated from the posterior probability ratio between the MAP decode word c* and the opposed decode word $c_{p,i}$ using the following expression (1).

$$R = (1 - 2c_i) \ln \left( \frac{P(c^* | S)}{P(c_{p,i} | S)} \right) \quad (1)$$

An external value of each dimension can be obtained by subtracting a soft-input value $S_i$ of the relevant dimension from the log posterior probability ratio R obtained by the expression (1). While the Max-log-MAP decoding is described in the present descriptions as an example of the decoding algorithm to calculate an external value from the intermediate hard decision value calculated in the middle of the decoding, other various decoding algorithms can be used.

Instead of the dimension-1 external value and the dimension-2 external value themselves, information required for calculation of the respective external values, such as a maximum-likelihood decode word or likelihood information thereof can be used as the value output from the SISO decoder 182 and recorded in the dimension-1 external-value memory 113 and the dimension-2 external-value memory 123. The maximum-likelihood decode word indicates a decode word most probable among the found decode words. In this case, at Step 121 in FIG. 6, the dimension-1 external value is calculated from information (the maximum-likelihood decode word, the likelihood information thereof, or the like) read from the dimension-2 external-value memory 123, and the calculated dimension-1 external value and the read information are added to calculate the dimension-1 soft-input value. Similarly, at Step S124 in FIG. 6, the dimension-2 external value is calculated from information (the maximum-likelihood decode word, the likelihood information thereof, or the like) read from the dimension-1 external-value memory 113 and the calculated dimension-2 external value and the read information are added to calculate the dimension-2 soft-input value.

In the above turbo decoding algorithm illustrated in FIG. 6, the dimension-1 external value and the dimension-2 external value or initial values of information required for calculation of these external values (hereinafter, collectively "dimension-1 external value information" and "dimension-2 external value information", respectively, for the sake of simplicity) are generally set to values that cause the LLRs respectively corresponding to bits or symbols constituting a received word to be '0'. That is, to perform the turbo decoding operation illustrated in FIG. 6, the dimension-1 external value information in the dimension-1 external-value memory 113 and the dimension-2 external value information in the dimension-2 external-value memory 123 are set to values that cause the LLRs respectively corresponding to the bits or symbols constituting a received word to be '0'.

A state where "the LLR is '0'" means that "the probability that a write bit is '0' and the probability that the write bit is '1' are equal". It implies that no information for determining whether the original value of the write bit is '0' or '1' is provided in a state where the dimension-1 external value information and the dimension-2 external value information are initial values. This reflects a fact that it is considered there is no information for determining whether the original value of the write bit is '0' or '1' at a time when the SISO decoder 182 has never performed decoding processing.

The dimension-1 external value information and the dimension-2 external value information thereafter change in the process of repeating the turbo decoding operation illustrated in FIG. 6. That is, when the turbo decoding operation illustrated in FIG. 6 is performed, the information (external value information) for determining whether the original value of the write bit is '0' or '1' is updated and reliability of the external value information is increased by repeating this execution. As a result, whether the original value of the write bit is '0' or '1' can be determined with high accuracy.

However, to enhance the reliability of the external value information to increase the error correction capability of the turbo decoding, a certain number of repetitions is required. Therefore, the time required for the decoding processing may be increased in some cases.

Therefore, in the present embodiment, a value that is calculated based on information output from a decoder other than the SISO decoder 182 is used as the initial values of the dimension-1 external value information and the dimension-2 external value information to shorten the time required for the decoding processing. For example, a hard-output value output from the HIHO decoder 181 can be used as the information output from a decoder other than the SISO decoder 182. However, the initial values are not limited to the hard-output value output from the HIHO decoder 181 and various values can be used to calculate the initial values of the dimension-1 external value information and the dimension-2 external value information as long as the values enable determination as to whether the original value of the write bit is '0' or '1'. For example, when a decoder that outputs a soft-output value as a decoding result is used instead of the HIHO decoder 181, a hard decision value obtained from the soft-output value can be used to calculate the initial values of the dimension-1 external value information and the dimension-2 external value information. In the present embodiment, a case where a hard-output value output from the HIHO decoder 181 is used to calculate the initial values of the dimension-1 external value information and the dimension-2 external value information is described as an example for clarification.

Figure 7:
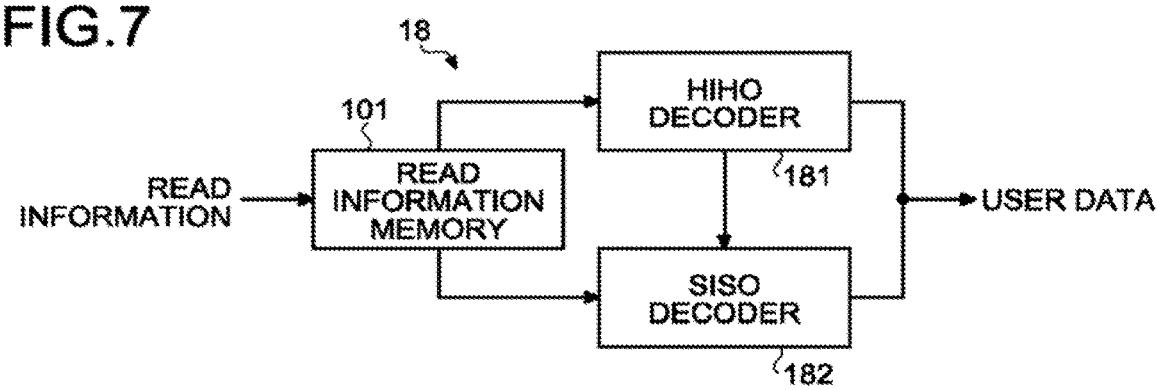
FIG. 7 is an explanatory diagram of an operation of the decoder according to the first embodiment.
Figure 8:
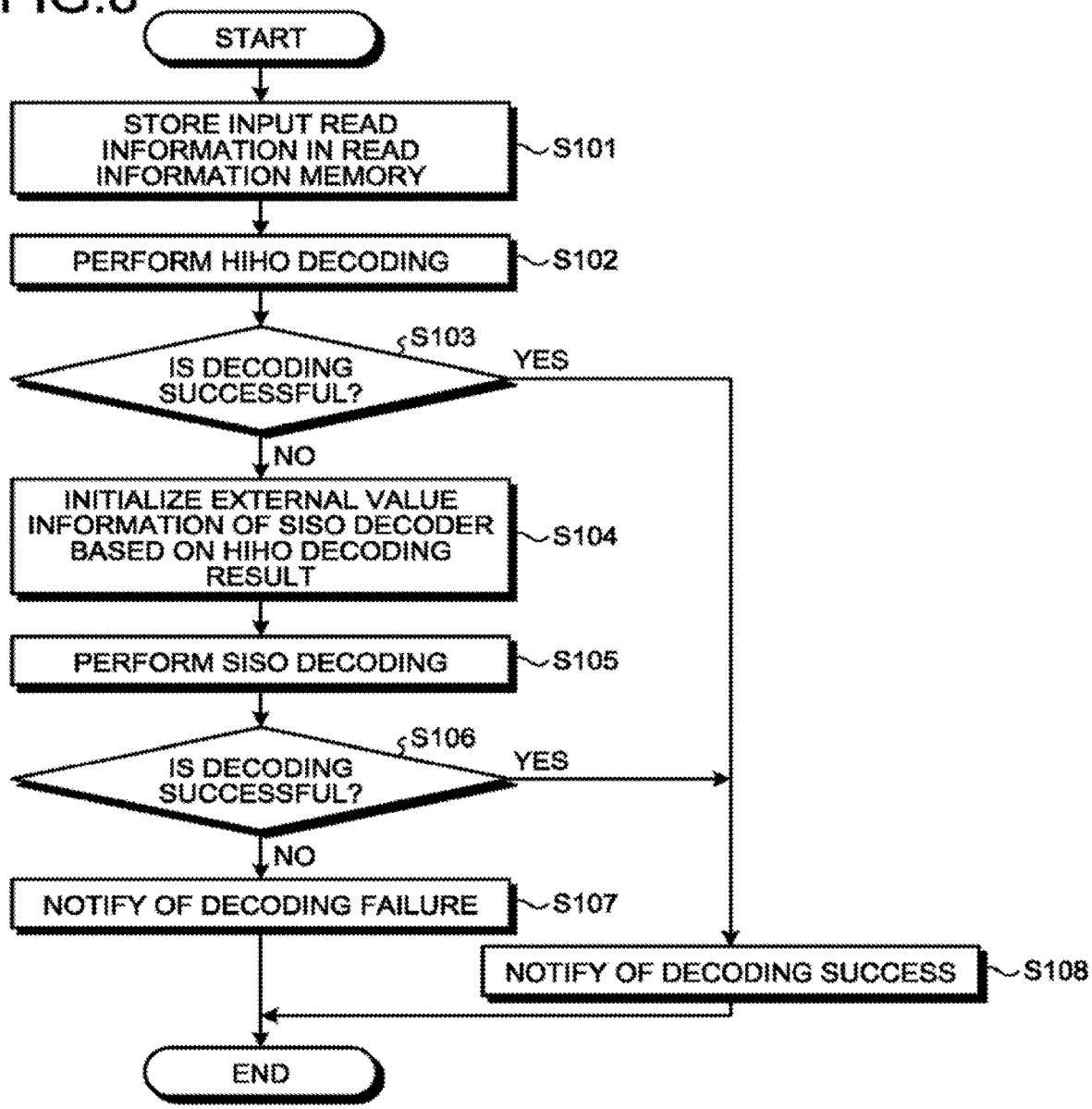
FIG. 8 is a flowchart illustrating an example of a general decoding operation according to the first embodiment.

FIG. 7 is an explanatory diagram of an operation of the decoder according to the present embodiment. FIG. 8 is a flowchart illustrating an example of a general decoding operation according to the present embodiment. As illustrated in FIG. 7, the decoder 18 includes the HIHO decoder 181 being a first decoder, the SISO decoder 182 being a second decoder, and the read information memory 101.

The read information memory 101 retains read information (a received word) read by the memory I/F 13 from the nonvolatile memory 20 as described above.

The HIHO decoder 181 performs, for example, decoding of a hard decision value as an input and outputs a hard decision value as a result thereof. Hard decision is processing of estimating a most probable original bit or symbol from read information. For example, when coded data is a binary code, the hard decision corresponds to processing of "outputting '0' when the probability that the original data is '0' is high and outputting '1' when the probability that the original data is '1' is high". However, the processing is not limited thereto and the HIHO decoder 181 can be variously modified, for example, to a decoder that performs decoding of a soft decision value as an input and outputs a hard decision value as a result thereof as long as the decoder can obtain a hard decision value from a decoding result.

The SISO decoder 182 includes, for example, an identical configuration to that illustrated as an example in FIG. 5 and performs decoding of a soft decision value as an input and outputs a soft decision value as a result thereof.

In a decoding operation performed by the decoder 18 configured as described above, read information of coded data that is read by the memory I/F 13 from the nonvolatile memory 20 and that is input to the encoding/decoding unit 14 is first stored in the read information memory 101 of the decoder 18 (Step S101) as illustrated in FIG. 8. The read information in the read information memory 101 can be, for example, coded data (a received word) of a soft decision value.

Next, the read information in the read information memory 101 is input to the HIHO decoder 181 and HIHO decoding of the read information is performed (Step S102). When the read information in the read information memory 101 is a soft decision value, read information of a hard decision value obtained by performing hard decision of the soft decision value is input to the HIHO decoder 181.

Next, whether the HIHO decoding has been successful is determined (Step S103). When the HIHO decoding has been successful (YES at Step S103), for example, the control unit 11 is notified of the success of the decoding, a decode word obtained by the HIHO decoding or user data restored from the decode word is transferred to the data buffer 12 (Step S108), and then the present operation ends. The user data transferred to the data buffer 12 is, for example, transferred to the host 30 via the host I/F 15 in accordance with control of the control unit 11.

On the other hand, when the HIHO decoding has not been successful (NO at Step S103), the dimension-1 external value information and the dimension-2 external value information of the SISO decoder 182 are initialized based on a result of the HIHO decoding (Step S104). In this initialization, for example, initial values of the dimension-1 external value information and the dimension-2 external value information are calculated from a hard decision value (hereinafter, "post-decoding hard decision value") obtained as a result of the HIHO decoding and/or a syndrome of each component code composed of the post-decoding hard decision value (hereinafter, the post-decoding hard decision value and/or the syndrome of each component code composed of the post-decoding hard decision value are referred to as "hard-decision decoding information") using a predetermined calculation formula. The calculated initial values do not always need to be stored in the dimension-1 external-value memory 113 and the dimension-2 external-value memory 123 and a necessary value can be calculated as required to be input to the dimension-1 adder 111 or the dimension-2 adder 121.

Next, the read information in the read information memory 101 is input to the SISO decoder 182 and the SISO decoding of the read information is performed (Step S105). At that time, the initial values set at Step S104 are used as the initial values of the dimension-1 external value information and the dimension-2 external value information. Accordingly, the SISO decoding can be started from a state where the dimension-1 external value information and the dimension-2 external value information are not '0' and thus the time required for the decoding processing can be shortened. A flow of the SISO decoding can be identical to that of the turbo decoding operation described with reference to FIG. 6.

Next, whether the SISO decoding has been successful is determined (Step S106). When the SISO decoding has been successful (YES at Step S106), for example, the control unit 11 is notified of the success of the decoding, a decode word obtained by the SISO decoding or user data restored from the decode word is transferred to the data buffer 12 (Step S108), and thus the present operation ends.

On the other hand, when the SISO decoding has not been successful (NO at Step S106), for example, the control unit 11 is notified of the failure of the decoding (Step S107) and then the present operation end. In this case, for example, the host 30 is notified of a read error.

A calculation method of the initial values of the dimension-1 external value information and the dimension-2 external value information according to the present embodiment is described in detail next with reference to drawings. However, the calculation method described below is merely an example and other calculation methods are not excluded. That is, the calculation method of the initial values of the dimension-1 external value information and the dimension-2 external value information can be variously modified as long as the calculation method can calculate the initial values of the dimension-1 external value information and the dimension-2 external value information without being restricted to values that cause the LLR for each of bits or symbols constituting the received word to be '0'. In the following descriptions, a case where each of component codes constituting a multidimensional error-correcting code is a linear code is described as an example. However, the present embodiment is not limited to this case and is applicable to various multidimensional error-correction codes.

FIG. 9 are diagrams illustrating an example of input/output information of the HIHO decoding according to the present embodiment. FIG. 10 is a diagram illustrating syndromes calculated from a post-decoding hard decision value illustrated in FIG. 9($b$). FIG. 9($a$) is a diagram illustrating an example of an error-correcting code for a hard decision value before the HIHO decoding (hereinafter, "pre-decoding hard decision value"). FIG. 9($b$) is a diagram illustrating an example of an error-correcting code for a hard decision value after the HIHO decoding (hereinafter, "post-decoding hard decision value"). Therefore, the pre-decoding hard decision value illustrated in FIG. 9($a$) is read information before decoding, which is read from the nonvolatile memory 20, and is input information (a hard-input value) to the HIHO decoder 181. The post-decoding hard decision value illustrated in FIG. 9($b$) is output information (a hard-output value) from the HIHO decoder 181. In the present descriptions, coded data (a code word) to be written to the nonvolatile memory 20 is assumed to be all-zero data where all bits are '0' for the sake of simplicity. In FIG. 9, for example, rows correspond to the dimension 1 in the product code 500 illustrated in FIG. 4 and columns correspond to the dimension 2 in the product code 500.

Some bits in the pre-decoding read information read from the nonvolatile memory 20 include an error as indicated by '1' in FIG. 9($a$). The pre-decoding hard decision value illustrated in FIG. 9($a$) is then subjected to the HIHO decoding by the HIHO decoder 181 to rewrite the values of some bits from '1' to '0' or '0' to '1' as illustrated in FIG. 9($b$). In FIG. 9($b$), bits having the value rewritten are hatched with diagonal lines.

When syndromes are calculated for the post-decoding hard decision value illustrated in FIG. 9($b$), syndromes of component codes including no error bit (component codes with row numbers #1, #3, and #5 and component codes with column numbers #1, #4, and #5, for example) become '0' and syndromes of component codes including an error (component codes with row numbers #2 and #4 and component codes with column numbers #2 and #3, for example) have a value not zero (non-zero) in most cases, as illustrated in FIG. 10.

Accordingly, the probability that the value of each of bits belonging to a component code whose syndrome is '0' is a correct value is expected to be high. For example, in the example illustrated in FIGS. 9($b$) and 10, the syndromes of the component codes with the row numbers #1, #3, and #5 and the component codes with the column numbers #1, #4, and #5 are '0'. Therefore, the probability that the value of each of bits belonging to these component codes is a correct value is expected to be high.

Therefore, in the present embodiment, external value information meaning that "the probability that the post-decoding hard decision value is correct is high" is set to a bit that is expected to have a high probability of being a correct value. For example, dimension-1 external value information meaning that "the probability that the post-decoding hard decision value is correct is high" is set to the component codes with the row numbers #1, #3, and #5 where the syndrome in the row direction is '0' Similarly, dimension-2 external value information meaning that "the probability that the post-decoding hard decision value is correct is high" is set to the component codes with the column numbers #1, #4, and #5 where the syndrome in the column direction is '0'.

Specifically, based on the definition of the LLR that whether an LLR is positive or negative corresponds to the original write value and the magnitude of the absolute value of an LLR is related to the probability that the original write value is a value estimated based on a positive or negative sign of the LLR, positive LLRs are set when the post-decoding hard decision value is '0' and negative LLRs are set when the post-decoding hard decision value is '1' as the dimension-1 external value and the dimension-2 external value, respectively. This enables the external value information meaning that "the probability that the post-decoding hard decision value is correct is high" to be set to a bit expected to have a high probability of being a correct value.

This is described with reference to the specific example illustrated in FIGS. 9 and 10. In the example illustrated in FIG. 9, the pre-decoding hard decision value and the post-decoding hard decision value of a bit (1, 1) on a first row and a first column (i=#1, j=#1) are both '0'. That is, as for the bit (1, 1), the LLR of the bit is a positive LLR estimated that "the probability of being '0' is high" in both a result of the read processing and a result of the HIHO decoding. Furthermore, as illustrated in FIG. 10, the syndrome of a component code of the dimension 1 with a row number i=#1 is '0'. In this case, the LLR of the initial value of the dimension-1 external value of the bit (1, 1) needs to be a positive value that does not invert the sign of the positive LLR. Meanwhile, the absolute value can be small because the hard decision value does not change before the HIHO decoding and after the HIHO decoding.

On the other hand, as for a bit (1, 3) on the first row and a third column (i=#1, j=#3), the post-decoding hard decision value is '0' while the pre-decoding hard decision value is '1' in the example illustrated in FIG. 9. That is, as for the bit (1, 3), the LLR of the bit, which is a negative LLR estimated that "the probability of being '1' is high" in a result of the read processing, changes to a positive LLR estimated that "the probability of being '0' is high" in a result of the HIHO decoding. However, the syndrome of the component codes of the dimension 1 on a row number i=#1 is '0' as illustrated in FIG. 10. In this case, the LLR of the initial value of the dimension-1 external value of the bit (1, 3) needs to be such a large positive value that inverts the sign of the negative LLR corresponding to '1' being the result of the read processing.

Therefore, in the present embodiment, for example, the initial value of the dimension-1 external value is calculated using the following expression (2). The initial value of the dimension-2 external value can be calculated by changing $S_{1,i}$ in the expression (2) to $S_{2,j}$ as indicated by the following expression (3).

The LLR of the initial value of the dimension-1 external value of a bit on (ith row, jth column)

$$= \begin{cases} 0 & \text{if } (S_{1,i} \neq 0) \\ (1 - 2d_{ij})X & \text{if } (S_{1,i} = 0 \text{ and } b_{ij} = d_{ij}) \\ (1 - 2d_{ij})Y & \text{if } (S_{1,i} = 0 \text{ and } b_{ij} \neq d_{ij}) \end{cases} \quad (2)$$

The LLR of the initial value of the dimension-2 external value of a bit on (ith row, jth column)

$$= \begin{cases} 0 & \text{if } (S_{2,j} \neq 0) \\ (1 - 2d_{ij})X & \text{if } (S_{2,j} = 0 \text{ and } b_{ij} = d_{ij}) \\ (1 - 2d_{ij})Y & \text{if } (S_{2,j} = 0 \text{ and } b_{ij} \neq d_{ij}) \end{cases} \quad (3)$$

In the expressions (2) and (3), $S_{1,i}$ is a post-decoding syndrome value of a component code of the ith row, $d_{ij}$ is a bit value of a post-decoding hard decision value on the ith row and the jth column, $b_{ij}$ is a bit value of a pre-decoding hard decision value on the ith row and the jth column, and X and Y are positive real numbers provided as parameters. In this case, for example, a relation $0 < X \leq Y$ holds between X and Y. A reason why Y has a larger value than X is that a larger external value needs to be set as an initial value when hard decision values differ between a result of the read processing and a result of the HIHO decoding as described above.

By using the expressions (2) and (3) as described above, for a bit belonging to a component code in a row direction or a column direction where the syndrome is '0', an LLR having a smaller absolute value is calculated as the initial value when the hard decision value does not change before the HIHO decoding and after the HIHO decoding, and an LLR having such a large absolute value that inverts the positive or negative sign of the LLR of the bit is calculated as the initial value of the external value when the hard decision value changes before the HIHO decoding and after the HIHO decoding. As for a bit belonging to a component code in a row direction or a column direction where the syndrome is 'non-zero', an LLR not including information to determine whether "the probability of being '0' is high" or "the probability of being '1' is high" with respect to the value of the bit (that is, the LLR=0) is calculated as the initial value of the external value.

The calculation method of the dimension-1 external value and the dimension-2 external value is not limited to the example described above. For example, the initial values of the dimension-1 external value and the dimension-2 external value can be obtained using a table or the like that outputs a previously-associated value in response to inputs of $b_{ij}$, $d_{ij}$, $S_{1,i}$, and $S_{2,j}$.

Even when the hard decision value changes before the HIHO decoding and after the HIHO decoding, the absolute value of the initial value of the external value can have such a magnitude that does not invert the positive or negative sign of the LLR of the bit in a case where the result of read is to be relied on more, such as in a case where the reliability of the syndrome calculation result of a component code is not so high.

FIG. 11 is a diagram illustrating an example of the initial value of the dimension-1 external value calculated from the pre-decoding hard decision value illustrated in FIG. 9(a), the post-decoding hard decision value illustrated in FIG. 9(b), and the syndromes calculated from the component codes after the HIHO decoding illustrated in FIG. 10 using the expressions (2) and (3). FIG. 12 is a diagram illustrating an example of the initial value of the dimension-2 external value similarly calculated from the pre-decoding hard decision value illustrated in FIG. 9(a), the post-decoding hard decision value illustrated in FIG. 9(b), and the syndromes calculated from the component codes after the HIHO decoding illustrated in FIG. 10 using the expressions (2) and (3). In calculation of the initial values illustrated in FIGS. 11 and 12, X is set to 5 and Y is set to 10 in the expressions (2) and (3).

In the calculation of the initial value of the dimension-1 external value illustrated in FIG. 11, '0' is obtained as the LLR of the initial value of the dimension-1 external value using an expression on the upper row in the expression (2) described above for bits belonging to the component codes with the row number i=#2 and #4 where the syndrome $S_{1,i}$ in the row direction is 'non-zero'. On the other hand, for bits having a hard decision value that does not change before the HIHO decoding (see FIG. 9(a)) and after the HIHO decoding (see FIG. 9(b)) among bits belonging to the component codes with the row number i=#1, #3, and #5 where the syndrome $S_{1,i}$ in the row direction is '0', '5' is obtained as the LLR of the initial value of the dimension-1 external value using an expression on the middle row in the expression (2) described above. However, for bits having a hard decision value that changes before the HIHO decoding (see FIG. 9(a)) and after the HIHO decoding (see FIG. 9(b)), '10' is obtained as the LLR of the initial value of the dimension-1 external value using an expression on the lower row in the expression (2) described above.

Similarly, in the calculation of the initial value of the dimension-2 external value illustrated in FIG. 12, '0' is obtained as the LLR of the initial value of the dimension-2 external value for bits belonging to the component codes with the column number j=#2 and #3 where the syndrome $S_{2,j}$ in the column direction is 'non-zero'. On the other hand, for bits having a hard decision value that does not change before the HIHO decoding (see FIG. 9(a)) and after the HIHO decoding (see FIG. 9(b)) among bits belonging to the component codes with the column number j=#1, #4, and #5 where the syndrome $S_{2,j}$ in the column direction is '0', '5' is obtained as the LLR of the initial value of the dimension-2 external value. For bits having a hard decision value that changes before the HIHO decoding (see FIG. 9(a)) and after the HIHO decoding (see FIG. 9(b)), '10' is obtained as the LLR of the initial value of the dimension-2 external value.

As described above, in the present embodiment, a value reflecting a result of the hard decision decoding is used as the initial value of the external value. Accordingly, the present embodiment can reduce the number of repetitions required until the external value of the turbo decoding has a value near a true decode word. As a result, the time required for the decoding can be shortened to realize a rapid read processing.

Furthermore, the hard decision decoding requires a relatively smaller calculation amount and can complete the processing faster than the soft decision decoding. Accordingly, the present embodiment has an advantage that the entire time of the decoding processing can be shortened more.

Second Embodiment

A memory system and a method of controlling a non-volatile memory according to a second embodiment is described in detail next with reference to drawings. The SISO decoder 182 according to the first embodiment needs to record the external values (soft decision decoding information) being probability information in the external value memories and thus has a risk that a memory amount required for decoding is increased. Therefore, in the second embodiment, a memory system and a method of controlling a non-volatile memory that can reduce the memory amount required for decoding is described using an example. In the following descriptions, constituent elements identical to those in the first embodiment are denoted by like reference signs and redundant descriptions thereof are omitted. In the present embodiment, a binary error-correcting code such as the product code 500 described with reference to FIG. 4 is used as a multidimensional error-correcting code for clarification of the descriptions.

A schematic configuration of the memory system according to the present embodiment can be identical to that described in the first embodiment with reference to FIGS. 2, 3, 5, and 7. A general decoding operation of the decoder 18 according to the present embodiment can be identical to the decoding operation described in the first embodiment with reference to FIG. 8. However, in the present embodiment, the SISO decoder 182 is replaced by a SISO decoder (also "approximate turbo decoder") 282 as described below.

Figure 13:
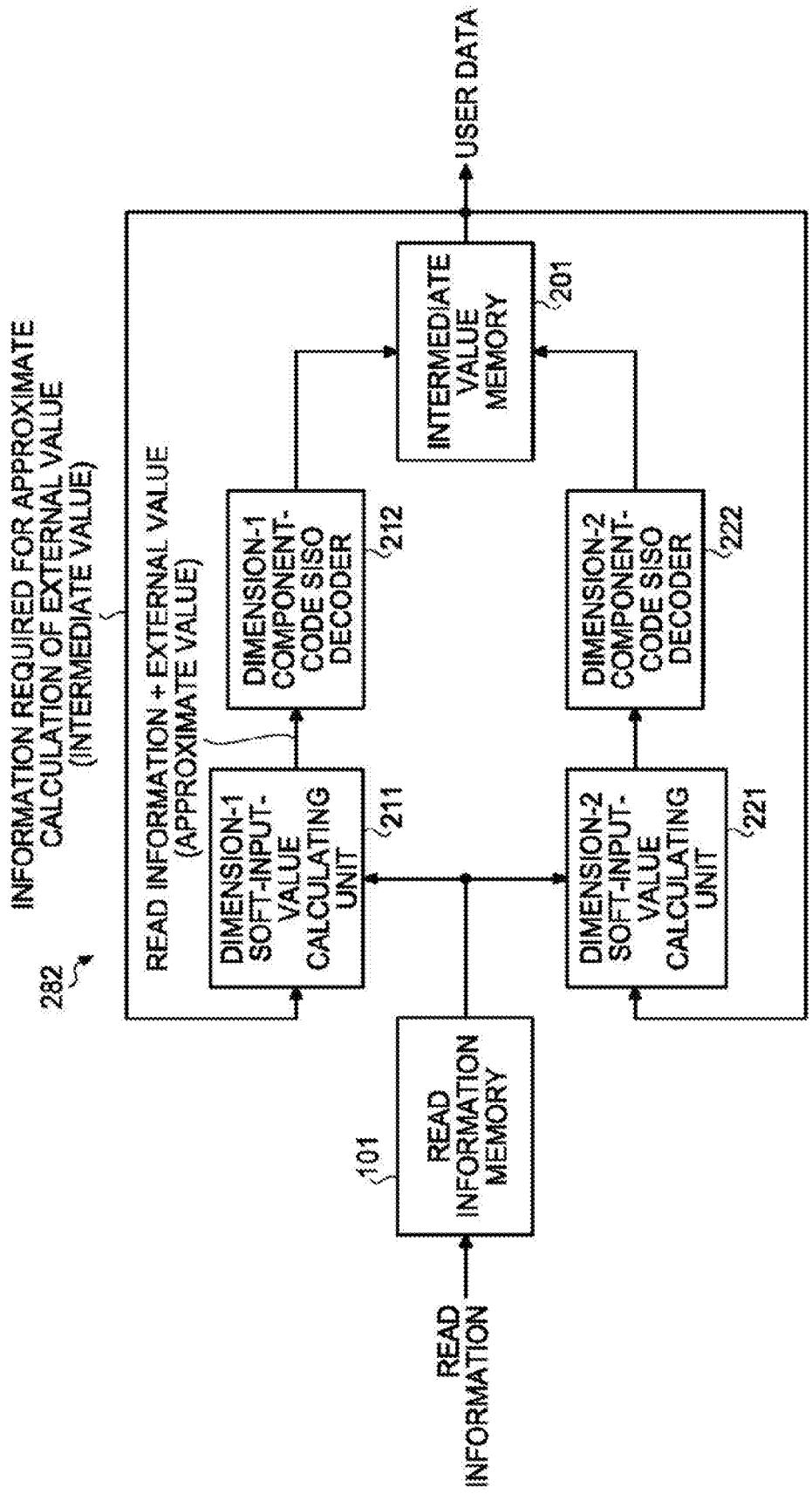
FIG. 13 is a block diagram illustrating a schematic configuration example of a SISO decoder according to a second embodiment.
Figure 14:
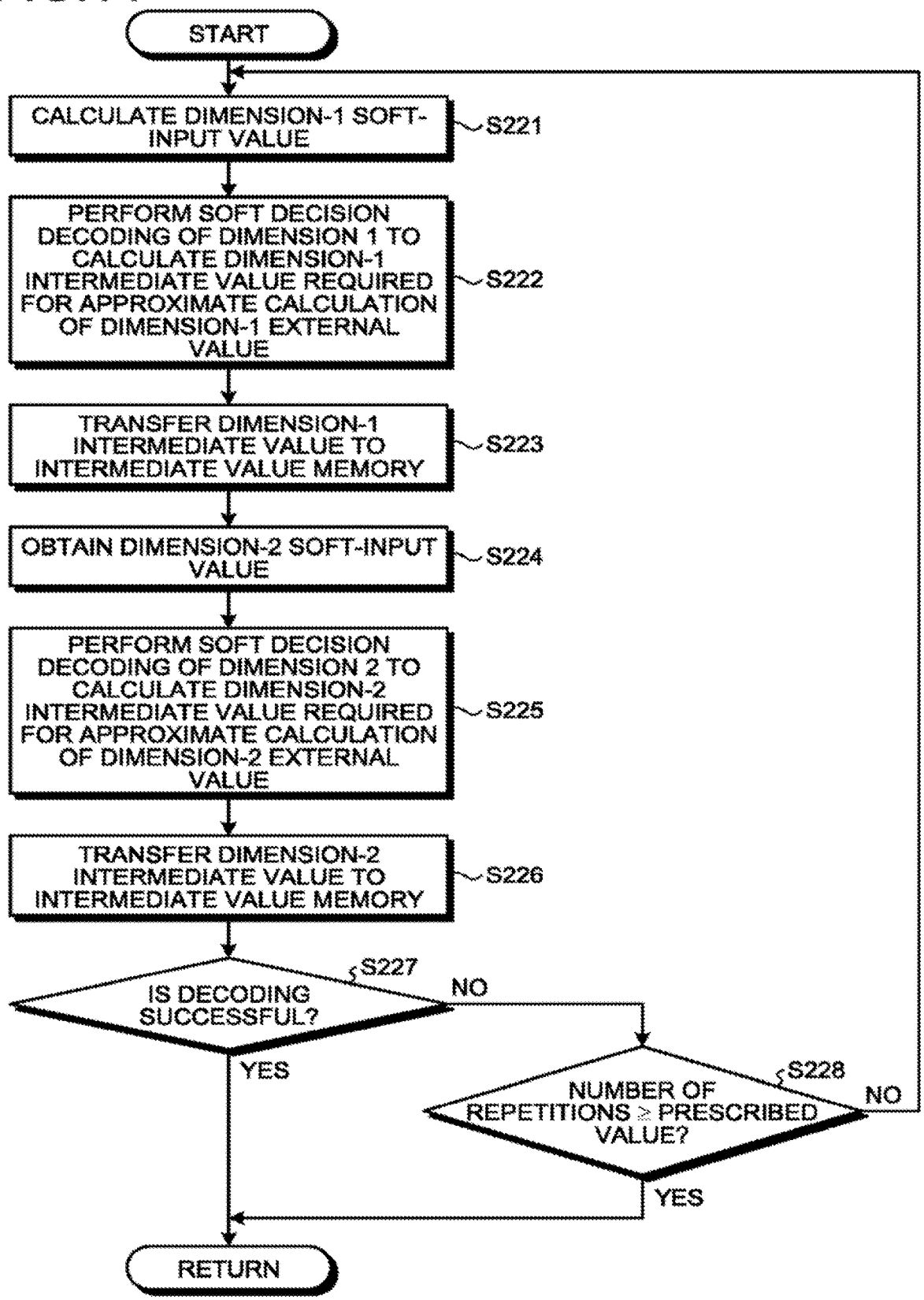
FIG. 14 is a flowchart illustrating an example of a turbo decoding operation performed by the SISO decoder illustrated in FIG. 13.

FIG. 13 is a block diagram illustrating a schematic configuration example of a SISO decoder according to the present embodiment. FIG. 14 is a flowchart illustrating an example of a turbo decoding operation performed by the SISO decoder illustrated in FIG. 13.

As illustrated in FIG. 13, the SISO decoder 282 according to the present embodiment has a configuration including an intermediate value memory 201, a dimension-1 soft-input-value calculating unit (a soft-input-value specifying unit) 211, a dimension-1 component-code SISO decoder 212, a dimension-2 soft-input-value calculating unit (a soft-input-value specifying unit) 221, and a dimension-2 component-code SISO decoder 222 and having the read information memory 101 provided at an input stage.

The dimension-1 soft-input-value calculating unit 211 and the dimension-2 soft-input-value calculating unit 221 calculate soft input values of corresponding dimensions with respect to each component code from the read information of the soft decision value retained in the read information memory 101 and an intermediate value (a dimension-1 intermediate value) of the dimension 1 and an intermediate value (a dimension-2 intermediate value) of the dimension 2 retained in the intermediate value memory 201.

An intermediate value (also "soft-decision decoding information") is information including an intermediate hard decision value of each component code calculated in the middle of decoding and reliability information of the intermediate hard decision value, and is information required for approximate calculation of an external value (a dimension-1 external value) of the dimension 1 and an external value (a dimension-2 external value) of the dimension 2. Reliability information of a certain intermediate hard decision value (a component code word) c is a metric indicating whether the probability that the component code c is an original component code word is high or low and calculated from the soft-input value (=probability information). For example, a posterior probability P calculated from a soft-input value S of the component code word c can be used as the reliability information of a binary code. However, the reliability information is not limited thereto and various types of information, such as a value indicating the probability that the component code word c is correct, a value of a distance function between the component code word c and the soft-input value, or a value obtained by applying a logarithmic function to these values, can be used as the reliability information.

The dimension-1 component-code SISO decoder 212 and the dimension-2 component-code SISO decoder 222 perform SISO decoding with respect to each component code for the input soft-input values of the respective dimensions, thereby calculating intermediate values of the corresponding dimensions, respectively.

In a turbo decoding operation performed by the SISO decoder 282 illustrated in FIG. 13, the read information in the read information memory 101 and the dimension-1 intermediate value and the dimension-2 intermediate value in the intermediate value memory 201 are input to the dimension-1 soft-input-value calculating unit 211 to calculate a dimension-1 soft-input value (Step S221) as illustrated in FIG. 14. However, in first calculation of the dimension-1 soft-input value, the dimension-1 intermediate value and the dimension-2 intermediate value are not stored in the intermediate value memory 201. Therefore, in the present embodiment, the hard decision value (the post-decoding hard decision value) obtained as a result of the HIHO decoding by the HIHO decoder 181 (see FIG. 7) and/or the syndrome value of each component code composed of the post-decoding hard decision value is used as the initial values of the dimension-1 intermediate value and the dimension-2 intermediate value. That is, in the present embodiment, the post-decoding hard decision value obtained as the HIHO decoding result at Step S104 in FIG. 8 and/or the syndrome value of each component code composed of the post-decoding hard decision value is set as the initial value in the intermediate value memory 201. The initial value does not always need to be stored in the intermediate value memory 201 and a necessary value can be calculated as required to be input to the dimension-1 soft-input-value calculating unit 211 or the dimension-2 soft-input-value calculating unit 221.

Next, the dimension-1 soft-input value calculated by the dimension-1 soft-input-value calculating unit 211 is input to the dimension-1 component-code SISO decoder 212 with respect to each component code of the dimension 1 to calculate a dimension-1 intermediate value (Step S222). The calculated dimension-1 intermediate value is transferred to the intermediate value memory 201 and is retained therein (Step S223).

Next, the read information in the read information memory 101 and the dimension-1 intermediate value and the dimension-2 intermediate value in the intermediate value memory 201 are input to the dimension-2 soft-input-value calculating unit 221 to calculate a dimension-2 soft-input value (Step S224). At that time, in first calculation of the dimension-2 soft-input value, a value obtained from the post-decoding hard decision value obtained as the HIHO decoding result and/or the syndrome value of each component code composed of the post-decoding hard decision value is used as the initial value of the dimension-2 intermediate value, similarly at Step S221.

Next, the dimension-2 soft-input value calculated by the dimension-2 soft-input-value calculating unit 221 is input to the dimension-2 component-code SISO decoder 222 with respect to each component code of the dimension 2 to calculate a dimension-2 intermediate value (Step S225). The calculated dimension-2 intermediate value is transferred to the intermediate value memory 201 and is retained therein (Step S226).

Next, whether decoding has been successful is determined (Step S227). A state where decoding has been successful can be, for example, that a decode word that can be determined to be correct has been found. Determination as to whether a found decode word is correct can be performed by, for example, a control unit (not illustrated) in the encoding/decoding unit 14. When the decoding has been successful (YES at Step S227), the process returns to the operation illustrated in FIG. 8 to determine a success of the decoding (YES at Step S106 in FIG. 8). The control unit 11 located outside or the like is then notified of the found decode word as well as the success of the decoding (Step S108 in FIG. 8), and the present operation ends. On the other hand, when the decoding has not been successful (NO at Step S227 in FIG. 14), whether the number of repetitions of the present operation has reached a prescribed value set in advance is determined (Step S228). When the number of repetitions has not reached the prescribed value (NO at Step S228), the process returns to Step S221 to perform the following operations. When the number of repetitions has reached the prescribed value (YES at Step S228), the process returns to the operation illustrated in FIG. 8 to determine a failure of the decoding (NO at Step S106 in FIG. 8). The control unit 11 located outside or the like is then notified of the failure of the decoding (Step S107 in FIG. 8) and the present operation ends. The number of repetitions can be the number of times that the operations at Step S221 to S226 in FIG. 14 have been repeated, for example.

Figure 15:
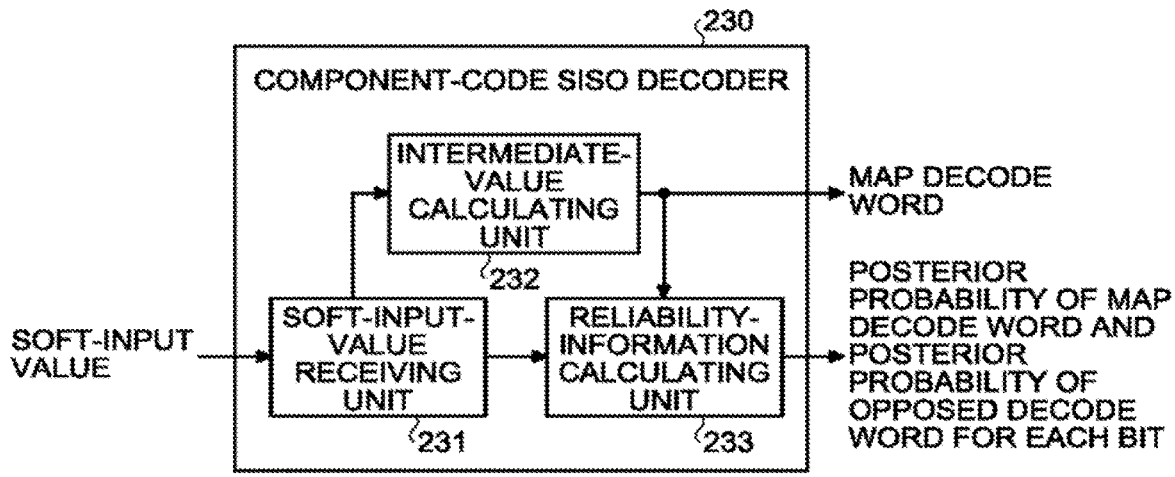
FIG. 15 is a block diagram illustrating a schematic configuration example of a component-code SISO decoder according to the second embodiment.

A configuration example of a component-code SISO decoder used for each of the dimension-1 component-code SISO decoder 212 and the dimension-2 component-code SISO decoder 222 illustrated in FIG. 13 is described in detail next with reference to drawings. FIG. 15 is a block diagram illustrating a schematic configuration example of the component-code SISO decoder according to the present embodiment.

In a case of conforming to the Max-log-MAP decoding algorithm described above, each of the dimension-1 component-code SISO decoder 212 and the dimension-2 component-code SISO decoder 222 can calculate a log posterior probability ratio by storing therein three kinds of values including a MAP decode word, a posterior probability of the MAP decode word, and a posterior probability of an opposed decode word at each bit with respect to each component code. Therefore, a component-code SISO decoder 230 according to the present embodiment includes a soft-input-value receiving unit 231, an intermediate-value calculating unit 232, and a reliability-information calculating unit 233 as illustrated in FIG. 15.

The soft-input-value receiving unit 231 receives the dimension-1 soft-input value/the dimension-2 soft-input value calculated by the dimension-1 soft-input-value calculating unit 211/the dimension-2 soft-input-value calculating unit 221 and outputs the received soft-input value to the intermediate-value calculating unit 232 and the reliability-information calculating unit 233.

The intermediate-value calculating unit 232 performs decoding processing such as Chase decoding or Ordered Statistics decoding of the input dimension-1 soft-input value/dimension-2 soft-input value to calculate a MAP decode word corresponding to an intermediate hard decision value with respect to a component code as a decoding target and outputs the calculated MAP decode word to the reliability-information calculating unit 233 and the intermediate value memory 201.

With respect to the component code as the decoding target, the reliability-information calculating unit 233 calculates a posterior probability of the MAP decode word and a posterior probability of an opposed decode word at each bit from the dimension-1 soft-input value/the dimension-2 soft-input value input from the soft-input-value receiving unit 231 and the MAP decode word input from the intermediate-value calculating unit 232 and outputs the calculated posterior probability of the MAP decode word and posterior probability of the opposed decode word at each bit as reliability information to the intermediate value memory 201.

Accordingly, with respect to the component code as the decoding target, the MAP decode word being an intermediate hard decision value in the middle of the decoding, and the posterior probability of the MAP decode word and the posterior probability of the opposed decode word at each bit being the reliability information are stored in the intermediate value memory 201.

Figure 16:
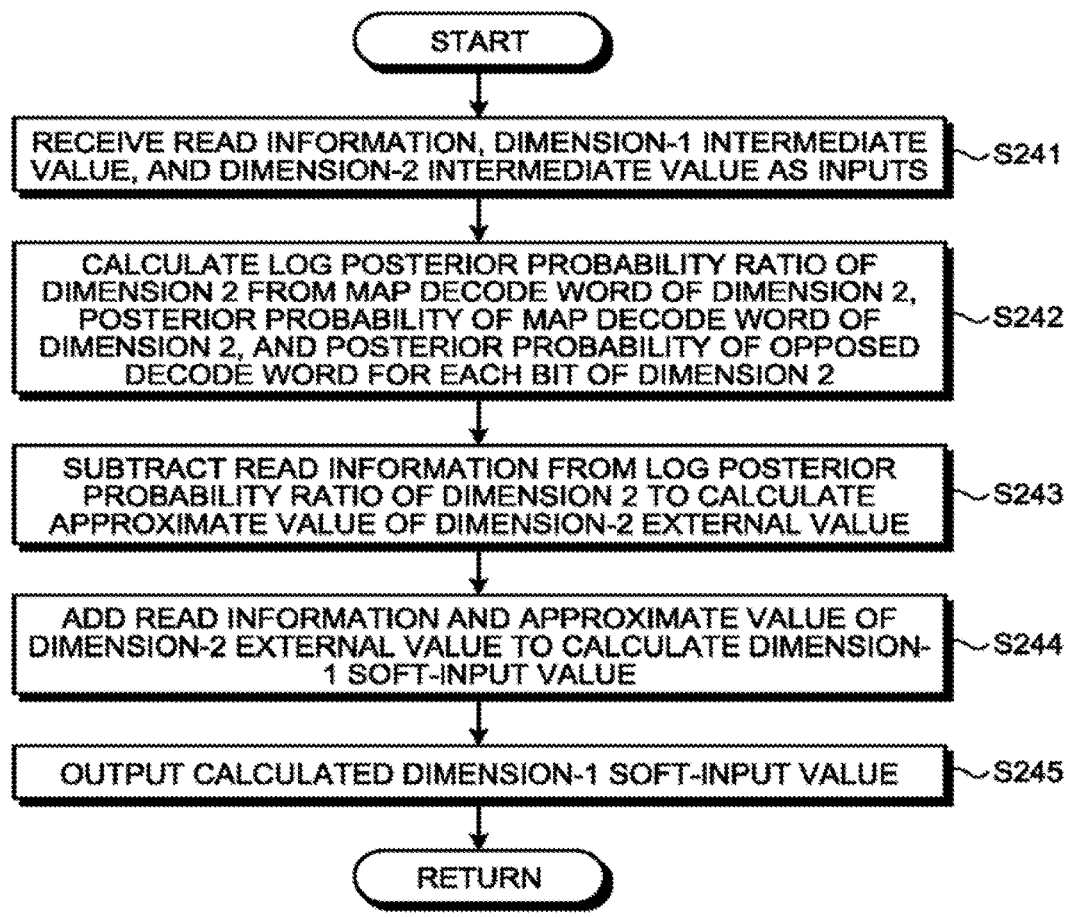
FIG. 16 is a flowchart illustrating an example of an operation flow of a dimension-1 soft-input-value calculating unit according to the second embodiment.

An operation flow at a time when the dimension-1 soft-input-value calculating unit 211 and the dimension-2 soft-input-value calculating unit 221 in FIG. 13 calculate the dimension-1 soft-input value and the dimension-2 soft-input value at Steps 221 and S224 in FIG. 14, respectively, is described in detail next with reference to drawings. FIG. 16 is a flowchart illustrating an example of an operation flow of the dimension-1 soft-input-value calculating unit according to the present embodiment. Although the operation of the dimension-1 soft-input-value calculating unit 211 is illustrated in FIG. 16, an identical operation can be applied to the dimension-2 soft-input-value calculating unit 221.

As illustrated in FIG. 16, to calculate the dimension-1 soft-input value, the dimension-1 soft-input-value calculating unit 211 first receives the read information from the read information memory 101 and receives the dimension-1 intermediate value and the dimension-2 intermediate value from the intermediate value memory 201 as inputs (Step S241). However, in first calculation of the dimension-1 soft-input value, a value calculated from the post-decoding hard decision value obtained as a HIHO decoding result and/or the syndrome value of each component code composed of the post-decoding hard decision value is used as the initial values of the intermediate values as described above. For example, the calculation is performed using the post-decoding hard decision value obtained as a HIHO decoding result as the calculated MAP decode word and setting the posterior probability of the calculated MAP decode word to 0.9 when the syndrome value of each component code is zero while otherwise setting the posterior probability to 0.1. The calculation is performed setting the posterior probability of the opposed decode word at each bit being to 0.1. However, the present embodiment is not limited to the calculation method and can be variously modified.

Next, the dimension-1 soft-input-value calculating unit 211 calculates an approximate value of the dimension-2 external value from the input read information, and the input dimension-1 intermediate value and dimension-2 intermediate value (or the post-decoding hard decision value and/or the syndrome value of each component code composed of the post-decoding hard decision value). Specifically, the dimension-1 soft-input-value calculating unit 211 calculates a log posterior probability ratio of the dimension 2 from the MAP decode word of the dimension 2, the posterior probability of the MAP decode word of the dimension 2, and the posterior probability of the opposed decode word for each bit of the dimension 2 in the dimension-2 intermediate value (or the post-decoding hard decision value of the dimension 2 and/or the syndrome value of each component code composed of the post-decoding hard decision value) (Step S242).

Although the dimension-2 external value can subsequently be obtained by subtracting the dimension-2 soft-input value from the log posterior probability ratio of the dimension 2 in the conventional Max-log-MAP decoding, the dimension-2 soft-input value is unknown at that time in the present embodiment. Therefore, in the present embodiment, the read information is substituted for an approximate value of the dimension-2 soft-input value and the read information is subtracted from the log posterior probability ratio of the dimension 2 to approximately calculate a dimension-2 external value (an approximate value) (Step S243).

Next, the approximate value of the dimension-2 external value calculated at Step S243 and the read information are added to calculate a dimension-1 soft-input value (Step S244). The calculated dimension-1 soft-input value is then output to the dimension-1 component-code SISO decoder 212 with respect to each component code of the dimension 1 (Step S245) and the process returns to the operations illustrated in FIG. 14.

As described above, even when the read information is substituted for an approximate value of the soft-input value, the finally-calculated soft-input value satisfactorily approximates the soft-input value that is to be calculated in the original turbo decoding. This suggests that the present embodiment enables the intermediate value memory 201 having a smaller capacity to be substituted for the dimension-1 external-value memory 113 and the dimension-2 external-value memory 123 in the configuration illustrated as an example in FIG. 5.

Specifically, it suffices to retain a hard decision value (corresponding to a MAP decode word) and reliability information as an external value in the present embodiment although a memory that retains an external value including respective information of a channel value, input external value information, a hard decision value, and reliability with respect to each dimension is required in the conventional Max-log-MAP decoding. Furthermore, one memory can be shared by all dimensions. As a result, according to the present embodiment, the memory amount required for decoding can be reduced.

Because other configurations, operations, and effects of the present embodiment are identical to those of the embodiment described above, detailed descriptions thereof are omitted.

Third Embodiment

A memory system and a method of controlling a nonvolatile memory according to a third embodiment is described in detail next with reference to drawings. A configuration of the memory system including an encoding/decoding unit in the present embodiment can be identical to the memory systems described as examples in the above embodiments with reference to FIGS. 2, 3, 7, 13, and 15 and thus redundant descriptions are omitted here. Furthermore, because a processing flow of an approximate turbo decoder according to the present embodiment can be identical to that described in the second embodiment with reference to FIG. 14, redundant descriptions are omitted here. However, in the present embodiment, an operation flow (Steps S221 and S224 in FIG. 14) of the dimension-1 soft-input-value calculating unit 211 and the dimension-2 soft-input-value calculating unit 221 is different from that described as an example in the second embodiment with reference to FIG. 16.

Figure 17:
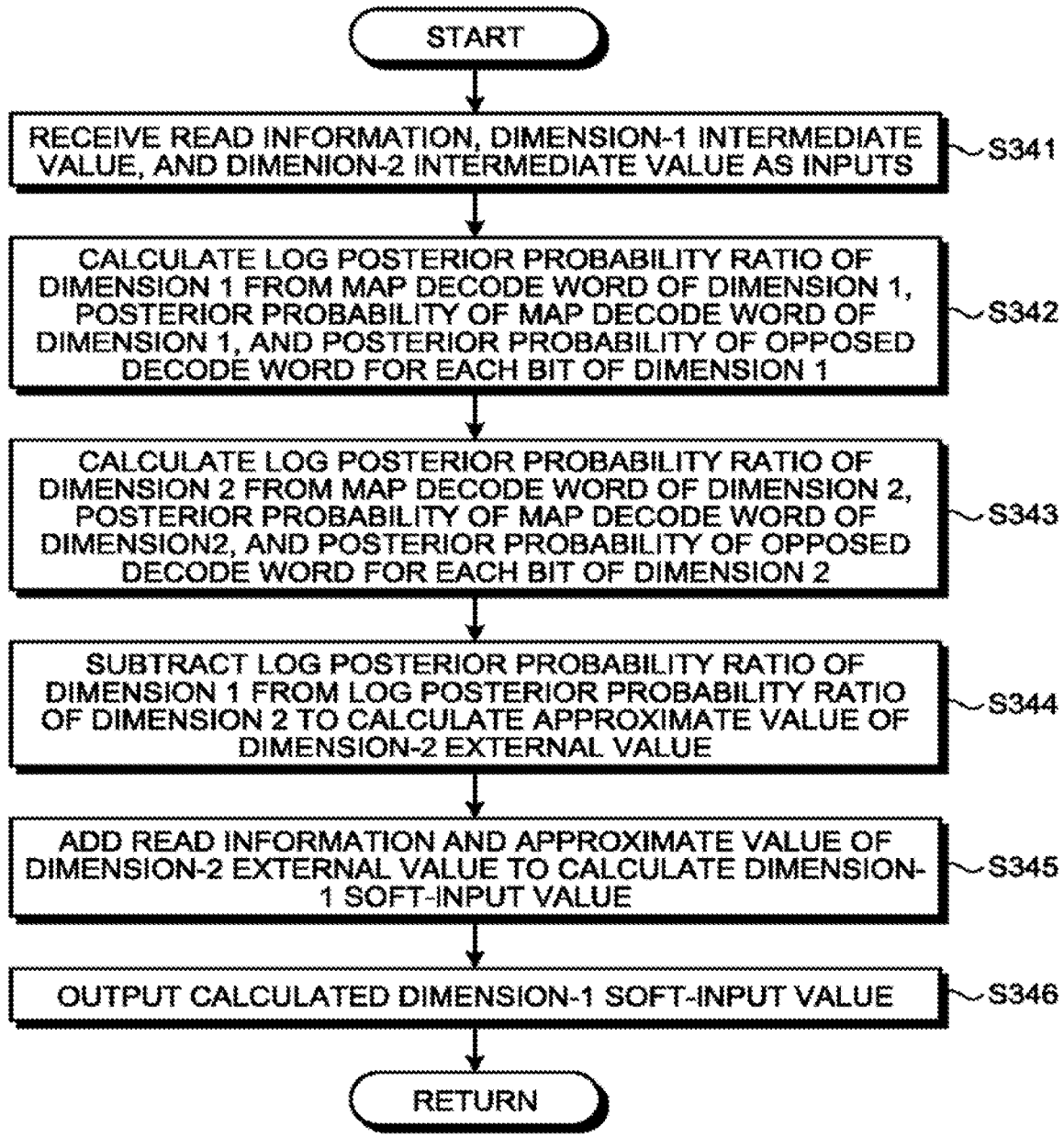
FIG. 17 is a flowchart illustrating an example of an operation flow of a dimension-1 soft-input-value calculating unit according to a third embodiment.

FIG. 17 is a flowchart illustrating an example of the operation flow of the dimension-1 soft-input-value calculating unit according to the present embodiment. Although FIG. 17 illustrates the operation of the dimension-1 soft-input-value calculating unit 211, an identical operation can be applied to the dimension-2 soft-input-value calculating unit 221. Among the operations illustrated in FIG. 17, operations identical to those illustrated in FIG. 16 are denoted by like reference signs and detailed descriptions thereof are omitted.

As illustrated in FIG. 17, the dimension-1 soft-input-value calculating unit 211 first receives the read information, and the dimension-1 intermediate value and the dimension-2 intermediate value (or the post-decoding hard decision value and/or the syndrome value of each component code composed of the post-decoding hard decision value) as inputs (Step S341), and calculates an approximate value of the dimension-2 external value from the input read information, and the input dimension-1 intermediate value and dimension-2 intermediate value (or the post-decoding hard decision value and/or the syndrome value of each component code composed of the post-decoding hard decision value) similarly at Step S241 in FIG. 16. However, in the present embodiment, the dimension-1 soft-input-value calculating unit 211 calculates the log posterior probability ratio of the dimension 1 from the MAP decode word of the dimension 1, the posterior probability of the MAP decode word of the dimension 1, and the posterior probability of the opposed decode word for each bit of the dimension 1 in the dimension-1 intermediate value (or the post-decoding hard decision value of the dimension 1 and/or the syndrome value of each component code composed of the post-decoding hard decision value) (Step S342). Subsequently, the dimension-1 soft-input-value calculating unit 211 calculates the log posterior probability ratio of the dimension 2 from the MAP decode word of the dimension 2, the posterior probability of the MAP decode word of the dimension 2, and the posterior probability of the opposed decode word for each bit of the dimension 2 in the dimension-2 intermediate value (or the post-decoding hard decision value of the dimension 2 and/or the syndrome value of each component code composed of the post-decoding hard decision value) (Step S343).

Subsequently, the dimension-2 external value can be obtained by subtracting the dimension-2 soft-input value from the log posterior probability ratio of the dimension 2 in the conventional Max-log-MAP decoding. However, in the present embodiment, the dimension-2 soft-input value is unknown at that time similarly in the second embodiment. Therefore, in the present embodiment, the log posterior probability ratio of the dimension 1 is substituted for an approximate value of the dimension-2 soft-input value and the log posterior probability ratio of the dimension 1 is subtracted from the log posterior probability ratio of the dimension 2 to approximately calculate the dimension-2 external value (an approximate value) (Step S344).

The dimension-1 soft-input-value calculating unit 211 then performs an identical operation to that at Step S244 and S245 described with reference to FIG. 16, thereby adding the approximate value of the dimension-2 external value and the read information to calculate the dimension-1 soft-input value (Step S345), outputs the calculated dimension-1 soft-input value to the dimension-1 component-code SISO decoder 212 with respect to each component code of the dimension 1 (Step S346), and the process returns to the operations illustrated in FIG. 14.

As described above, even when the log posterior probability ratio of one of the dimensions is substituted for an approximate value of the soft-input value of the other dimension, the finally-calculated soft-input value satisfactorily approximates a soft-input value that is to be calculated in the original turbo decoding. Accordingly, similarly in the second embodiment, the intermediate value memory 201 having a smaller capacity can be substituted for the dimension-1 external-value memory 113 and the dimension-2 external-value memory 123 in the configuration described as an example in FIG. 5 and the memory amount required for decoding can be reduced.

Because other configurations, operations, and effects of the present embodiment are identical to those of the embodiments described above, detailed descriptions thereof are omitted.

Fourth Embodiment

A memory system and a method of controlling a nonvolatile memory according to a fourth embodiment is described next. The operation flow of the dimension-1 soft-input-value calculating unit 211/the dimension-2 soft-input-value calculating unit 221 described as an example with reference to FIG. 16 in the second embodiment and the operation flow of the dimension-1 soft-input-value calculating unit 211/the dimension-2 soft-input-value calculating unit 221 described as an example with reference to FIG. 17 in the third embodiment can be selectively switched and used under a specific condition. For example, the present embodiment can be configured to switch between the operation flows to be performed according to the posterior probability of the MAP decode word in such a manner that the dimension-1 soft-input value or the dimension-2 soft-input value is obtained using the operation flow illustrated in FIG. 17 when the posterior probability of the MAP decode word of the dimension 1 or the dimension 2 is higher than a threshold determined in advance, and otherwise the dimension-1 soft-input value or the dimension-2 soft-input value is obtained using the operation flow illustrated in FIG. 16.

Also in this configuration, the intermediate value memory 201 having a smaller capacity can be substituted for the dimension-1 external-value memory 113 and the dimension-2 external-value memory 123 in the configuration described as an example in FIG. 5 and the memory amount required for decoding can be reduced, similarly to the embodiments described above.

Because other configurations, operations, and effects of the present embodiments are identical to those of the embodiments described above, detailed descriptions thereof are omitted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
 a nonvolatile memory that records therein a multidimensional error-correcting code in which at least one of symbols constituting a code is protected at least by a first component code and a second component code different from the first component code;
 a memory interface that reads the multidimensional error-correcting code recorded in the nonvolatile memory as read information;
 a first decoder that performs decoding of the read information to output hard decision decoding information of each symbol;
 a second decoder that performs soft decision decoding in units of component codes for the read information using a soft-input value to output soft decision decoding information of each symbol;
 a soft-decision-decoding information memory that retains the soft decision decoding information of each symbol output from the second decoder; and
 a soft-input-value specifying unit that obtains the soft-input value of each symbol using the read information and the hard decision decoding information or the soft decision decoding information, wherein
 the soft-input-value specifying unit
 obtains an initial value of the soft-input value using the read information and the hard decision decoding information, and outputs an output decode word obtained as a result of the soft decision decoding when the output decode word is determined to be correct.

2. The memory system according to claim 1, wherein the hard decision decoding information includes a post-decoding hard decision value of each symbol, obtained by the decoding of the read information performed by the first decoder.

3. The memory system according to claim 2, wherein the first component code and the second component code are linear codes, respectively, and the hard decision decoding information further includes a syndrome for each component code obtained from the post-decoding hard decision value.

4. The memory system according to claim 3, wherein the soft-input-value specifying unit obtains the initial value of the soft-input value using the syndrome for each component code in addition to the read information and the post-decoding hard decision value.

5. The memory system according to claim 1, wherein the soft-input-value specifying unit changes the initial value based on whether hard decision values of a symbol before and after the decoding by the first decoder match each other.

6. The memory system according to claim 1, wherein the soft-input-value specifying unit sets the soft-input value of a symbol belonging to a component code where a syndrome for each component code obtained from the hard decision decoding information is not zero to be equal to the read information.

7. The memory system according to claim 1, wherein the multidimensional error-correcting code includes at least one component code in a row direction and at least one component code in a column direction, and
the soft-input-value specifying unit calculates the initial value in the row direction using a following expression (1) and calculates the initial value in the column direction using a following expression (2) where a syndrome for the hard decision decoding information of a component code on an ith row is $S_{1,i}$, a syndrome for the hard decision decoding information of a component code on a jth column is $S_{2,j}$, a bit value of post-decoding hard decision value on the ith row and the jth column is $d_{ij}$, a bit value of a pre-decoding hard decision value on the ith row and the jth column is $b_{ij}$, and X and Y are positive real numbers provided as parameters, respectively, The LLR of the initial value of the dimension–1 external value of a bit on (ith row, jth column)

$$= \begin{cases} 0 & \text{if } (S_{1,i} \neq 0) \\ (1-2d_{ij})X & \text{if } (S_{1,i} = 0 \text{ and } b_{ij} = d_{ij}), \\ (1-2d_{ij})Y & \text{if } (S_{1,i} = 0 \text{ and } b_{ij} \neq d_{ij}) \end{cases} \quad (1)$$

The LLR of the initial value of the dimension–2 external value of a bit on (ith row, jth column)

$$= \begin{cases} 0 & \text{if } (S_{2,j} \neq 0) \\ (1-2d_{ij})X & \text{if } (S_{2,j} = 0 \text{ and } b_{ij} = d_{ij}). \\ (1-2d_{ij})Y & \text{if } (S_{2,j} = 0 \text{ and } b_{ij} \neq d_{ij}) \end{cases} \quad (2)$$

8. The memory system according to claim 7, wherein the Y is a positive real number equal to or greater than the X.

9. The memory system according to claim 1, wherein the soft-input-value specifying unit specifies the initial value using a table that retains a correspondence relation between a combination of the read information and the hard decision decoding information, and the initial value.

10. The memory system according to claim 1, wherein
the second decoder outputs an external value as a result of the soft decision decoding, and
the soft-decision-decoding information memory updates the retained soft decision decoding information with the external value output from the second decoder.

11. The memory system according to claim 1, wherein
the second decoder outputs information required for calculation of an external value including a most probable decode word, and
the soft-decision-decoding information memory updates the retained soft decision decoding information with the information required for calculation of the external value output from the second decoder.

12. The memory system according to claim 1, further comprising a read information memory that retains the read information, wherein
the soft-decision-decoding information memory retains a first decode word of the first component code and a second decode word of the second component code as the soft decision decoding information,
the soft-input-value specifying unit includes
a first soft-input-value calculating unit that calculates a soft-input value of the first component code using the second decode word retained in the soft-decision-decoding information memory and read information related to the second component code retained in the read information memory, and
a second soft-input-value calculating unit that calculates a soft-input value of the second component code using the first decode word retained in the soft-decision-decoding information memory and read information related to the first component code retained in the read information memory,
the second decoder includes
a first soft decision decoder that decodes a soft-input value of the first component code with respect to the first component code to calculate a new first decode word of the first component code and updates the first decode word in the soft-decision-decoding information memory with the calculated new first decode word, and
a second soft decision decoder that decodes a soft-input value of the second component code with respect to the second component code to calculate a new second decode word of the second component code and updates the second decode word in the soft-decision-decoding information memory with the calculated new second decode word,
the first soft-input-value calculating unit calculates an initial value of the soft-input value of the first component code using the read information and the hard decision decoding information of the second component code, and
the second soft-input value calculating unit calculates an initial value of the soft-input value of the second component code using the read information and the hard decision decoding information of the first component code.

13. The memory system according to claim 1, wherein the second decoder performs repeatedly the soft decision decoding in the units of the component codes until the decoding is performed successfully, and determines that the soft decision decoding fails when number of repetitions of the soft decision decoding reaches a predetermined number.

14. The memory system according to claim 1, wherein
the memory interface reads the multidimensional error-correcting code as the read information of a hard decision value or a soft decision value,
the first decoder receives a hard decision value or a soft decision value as an input and outputs the hard decision decoding information, and
the second decoder receives a soft decision value as an input and outputs a soft decision value.

15. A method of controlling a nonvolatile memory that records therein a multidimensional error-correcting code in which at least one of symbols constituting a code is protected at least by a first component code and a second component code different from the first component code, the method comprising:
reading the multidimensional error-correcting code recorded in the nonvolatile memory as read information;
performing first decoding processing to perform decoding of the read information to output hard decision decoding information of each symbol;
performing second decoding processing to perform soft decision decoding in units of component codes for the read information using a soft-input value to output soft decision decoding information of each symbol;
retaining the soft decision decoding information of each symbol that is output in the second decoding processing; and
performing soft-input-value specifying processing to obtain the soft-input value of each symbol using the read information and the hard decision decoding information or the soft decision decoding information, wherein
an initial value of the soft-input value is obtained using the read information and the hard decision decoding information in the soft-input-value specifying processing, and
an output decode word obtained as a result of the soft decision decoding is output when the output decode word is determined to be correct.

16. The method according to claim 15, wherein the hard decision decoding information includes a post-decoding hard decision value of each symbol, obtained by the decoding of the read information.

17. The method according to claim 16, wherein
the first component code and the second component code are linear codes, respectively, and
the hard decision decoding information further includes a syndrome for each component code obtained from the post-decoding hard decision value.

18. The method according to claim 17, wherein the soft-input-value specifying processing obtains the initial value of the soft-input value using the syndrome for each component code in addition to the read information and the post-decoding hard decision value.

19. The method according to claim 15, wherein
the multidimensional error-correcting code includes at least one component code in a row direction and at least one component code in a column direction, and
the soft-input-value specifying processing calculates the initial value in the row direction using a following expression (3) and calculates the initial value in the column direction using a following expression (4) where a syndrome for the hard decision decoding information of a component code on an ith row is $S_{1,i}$, a syndrome for the hard decision decoding information of a component code on a jth column is $S_{2,j}$, a bit value of post-decoding hard decision value on the ith row and the jth column is $d_{ij}$, a bit value of a pre-decoding hard decision value on the ith row and the jth column is $b_{ij}$, and X and Y are positive real numbers provided as parameters, respectively, The LLR of the initial value of the dimension-1 external value of a bit on (ith row, jth column)

$$= \begin{cases} 0 & \text{if } (S_{1,i} \neq 0) \\ (1-2d_{ij})X & \text{if } (S_{1,i} = 0 \text{ and } b_{ij} = d_{ij}) , \\ (1-2d_{ij})Y & \text{if } (S_{1,i} = 0 \text{ and } b_{ij} \neq d_{ij}) \end{cases} \quad (3)$$

The LLR of the initial value of the dimension-2 external value of a bit on (ith row, jth column)

$$= \begin{cases} 0 & \text{if } (S_{2,j} \neq 0) \\ (1-2d_{ij})X & \text{if } (S_{2,j} = 0 \text{ and } b_{ij} = d_{ij}) . \\ (1-2d_{ij})Y & \text{if } (S_{2,j} = 0 \text{ and } b_{ij} \neq d_{ij}) \end{cases} \quad (4)$$

20. The method according to claim 15, wherein the soft-input-value specifying processing specifies the initial value using a table that retains a correspondence relation between a combination of the read information and the hard decision decoding information, and the initial value.

* * * * *